United States Patent
Lee et al.

(10) Patent No.: US 11,335,701 B2
(45) Date of Patent: May 17, 2022

(54) SEMICONDUCTOR SWITCHING DEVICES HAVING FERROELECTRIC LAYERS THEREIN AND METHODS OF FABRICATING SAME

(71) Applicant: Samsung Electronics Co., Ltd., Suwon-si (KR)

(72) Inventors: Byounghoon Lee, Suwon-si (KR); Jongho Park, Suwon-si (KR); Musarrat Hasan, Sejong-si (KR); Wandon Kim, Seongnam-si (KR); Seungkeun Cha, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/780,006

(22) Filed: Feb. 3, 2020

(65) Prior Publication Data

US 2021/0035989 A1 Feb. 4, 2021

(30) Foreign Application Priority Data

Jul. 29, 2019 (KR) .................. 10-2019-0092002

(51) Int. Cl.
*H01L 27/1159* (2017.01)
*H01L 29/78* (2006.01)
*H01L 27/11585* (2017.01)
*H01L 29/51* (2006.01)

(52) U.S. Cl.
CPC .... *H01L 27/1159* (2013.01); *H01L 27/11585* (2013.01); *H01L 29/511* (2013.01); *H01L 29/516* (2013.01); *H01L 29/78391* (2014.09)

(58) Field of Classification Search
CPC .......... H01L 27/11585; H01L 27/1159; H01L 29/4966; H01L 29/511; H01L 29/516; H01L 29/78391
See application file for complete search history.

(56) References Cited

U.S. PATENT DOCUMENTS

| | | | |
|---|---|---|---|
| 9,269,785 B2 | 2/2016 | Mueller et al. | |
| 9,349,842 B2 | 5/2016 | Schloesser et al. | |
| 9,679,893 B2 | 6/2017 | Yan et al. | |
| 9,768,030 B2 | 9/2017 | Lee | |
| 9,793,397 B1 | 10/2017 | Ando et al. | |
| 10,176,859 B2 | 1/2019 | Duenkel et al. | |
| 11,038,034 B2 * | 6/2021 | Lee .............. | H01L 29/513 |
| 2012/0315749 A1 * | 12/2012 | Hempel ......... | H01L 21/28176 438/591 |
| 2015/0357429 A1 * | 12/2015 | Dubourdieu ....... | H01L 29/516 257/295 |

(Continued)

FOREIGN PATENT DOCUMENTS

KR 10-0155866 B1 10/1998

OTHER PUBLICATIONS

US 10,164,094 B2, 12/2018, Tu et al. (withdrawn)

*Primary Examiner* — Matthew E Warren
(74) *Attorney, Agent, or Firm* — Myers Bigel, P.A.

(57) ABSTRACT

A semiconductor device includes a substrate, a channel on or in the substrate, a source/drain pair respectively on opposite ends of the channel, and a gate structure on the channel between the source/drain pair, wherein the gate structure includes an interfacial layer, a ferroelectric layer, a stabilization layer, an oxygen diffusion barrier layer, and a threshold voltage control layer that are sequentially stacked on the channel.

11 Claims, 28 Drawing Sheets

(56) References Cited

U.S. PATENT DOCUMENTS

| | | | |
|---|---|---|---|
| 2016/0225867 A1* | 8/2016 | Kim | H01L 29/4966 |
| 2017/0125408 A1* | 5/2017 | Park | H01L 27/088 |
| 2017/0309488 A1 | 10/2017 | Sakai et al. | |
| 2017/0365719 A1 | 12/2017 | Chen et al. | |
| 2018/0269216 A1 | 9/2018 | Lee | |
| 2018/0277550 A1 | 9/2018 | Yoo | |
| 2019/0057971 A1 | 2/2019 | Tsukamoto | |
| 2019/0067488 A1 | 2/2019 | Tsai et al. | |
| 2019/0333769 A1* | 10/2019 | Chen | H01L 29/4966 |
| 2020/0006547 A1* | 1/2020 | Hsu | H01L 29/516 |

* cited by examiner

SEMICONDUCTOR SWITCHING DEVICES HAVING FERROELECTRIC LAYERS THEREIN AND METHODS OF FABRICATING SAME

REFERENCE TO PRIORITY APPLICATION

This application claims the benefit of Korean Patent Application No. 10-2019-0092002, filed Jul. 29, 2019, in the Korean Intellectual Property Office, the disclosure of which is hereby incorporated herein by reference.

BACKGROUND

The inventive concept relates to semiconductor devices and methods of manufacturing the same. In particular, the inventive concept relates to a semiconductor device containing a ferroelectric layer, and a method of manufacturing the semiconductor device.

Theoretically, a minimum value of a subthreshold swing of a field-effect transistor is considered to be 60 mV/dec. However, in order to overcome the theoretical limitation, a ferroelectric field-effect transistor (FeFET), which contains a ferroelectric layer capable of providing a negative capacitance characteristic when used as a gate insulating layer, has been considered. In order for a ferroelectric material to have a ferroelectric property, the ferroelectric material should have a phase with a certain crystal structure. Therefore, after forming a ferroelectric layer, a process of annealing the ferroelectric layer may be performed to form the desired phase having a certain crystal structure therein.

SUMMARY

The inventive concept provides a semiconductor device having a thin interfacial layer and a method of manufacturing the semiconductor device. The inventive concept provides a semiconductor device including a ferroelectric layer having an improved ferroelectric property and a method of manufacturing the semiconductor device.

According to an aspect of the inventive concept, there is provided a semiconductor device, which includes a substrate, a channel in or on the substrate and a source/drain pair respectively on opposite ends of the channel. A gate structure is also provided on the channel, between the source/drain pair. The gate structure includes an interfacial layer, a ferroelectric layer, a stabilization layer, an oxygen diffusion barrier layer, and a threshold voltage control layer, which can be sequentially stacked on the channel.

According to another embodiment of the invention, there is provided a semiconductor device including a substrate having a first region and a second region therein. A first transistor, which includes a first gate structure, is provided on the first region of the substrate, and a second transistor, which includes a second gate structure, is provided on the second region of the substrate. According to some embodiments of the invention, the first gate structure includes a first interfacial layer, a first ferroelectric layer, a first stabilization layer, and a first threshold voltage control layer, which may be sequentially stacked on the first region of the substrate. In addition, the second gate structure can include a second interfacial layer, a second ferroelectric layer, and a second threshold voltage control layer directly on the second ferroelectric layer, and these layers may be sequentially stacked on the second region of the substrate.

According to a further embodiment of the invention, there is provided a semiconductor device including a substrate having a first region and a second region therein. A first gate structure is provided on the first region of the substrate, and a second gate structure is provided on the second region of the substrate. The first gate structure includes a first interfacial layer, a first ferroelectric layer, a first stabilization layer, a first oxygen diffusion barrier layer, and a first threshold voltage control layer, which are sequentially stacked on the first region of the substrate. The second gate structure includes a second interfacial layer, a second ferroelectric layer, a second stabilization layer, and a second threshold voltage control layer directly on the second stabilization layer. These layers may be sequentially stacked on the second region of the substrate.

According to a still further embodiment of the invention, a method of manufacturing a semiconductor device is provided, which includes forming an interfacial layer and a ferroelectric layer sequentially on a substrate, forming a stabilization layer on the ferroelectric layer, forming an oxygen diffusion barrier layer on the stabilization layer, forming a silicon layer on the oxygen diffusion barrier layer, and then annealing the ferroelectric layer.

According to another embodiment of the invention, a method of manufacturing a semiconductor device includes forming an interfacial layer, a ferroelectric layer, a stabilization layer, and a sacrificial layer sequentially on each of a first region and a second region of a substrate. A step is also performed to anneal the ferroelectric layer. Additional steps include removing the sacrificial layer, and removing a portion of the stabilization layer on the second region of the substrate. A step is also performed to form a first threshold voltage control layer on the stabilization layer (on the first region of the substrate), and form a second threshold voltage control layer on a portion of the ferroelectric layer (on the second region of the substrate).

According to another embodiment of the inventive concept, there is provided a method of manufacturing a semiconductor device, which includes forming a channel in or on a substrate, forming an interfacial layer, a ferroelectric layer, a stabilization layer, an oxygen diffusion barrier layer, and a sacrificial layer sequentially on the channel, before annealing the ferroelectric layer. The sacrificial layer is then removed. A threshold voltage control layer is also formed on the oxygen diffusion barrier layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
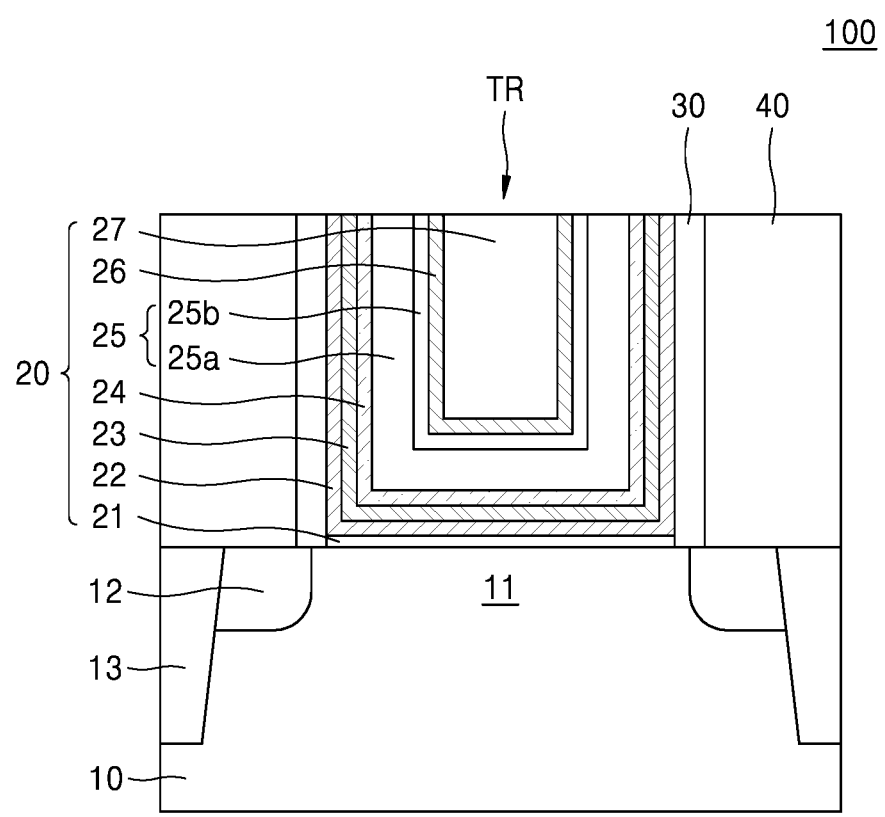
FIG. 1 is a cross-sectional view of a semiconductor device according to an embodiment.

FIG. 1 is a cross-sectional view of a semiconductor device 100 according to an embodiment. Referring to FIG. 1, the semiconductor device 100 may include a substrate 10 and a transistor TR on the substrate 10. The substrate 10 may include a semiconductor material such as a Group IV semiconductor material, a Group III-V semiconductor material, or a Group II-VI semiconductor material. The Group IV semiconductor material may include, for example, silicon (Si), germanium (Ge), or Si—Ge. The Group III-V semiconductor material may include, for example, gallium arsenide (GaAs), indium phosphor (InP), indium arsenide (InAs), indium antimony (InSb), or indium gallium arsenide (InGaAs). The Group II-VI semiconductor material may include, for example, zinc telluride (ZnTe) or cadmium sulfide (CdS). The substrate 10 may be formed from bulk wafer material (e.g., a boule) or as an epitaxial layer.

The transistor TR may include a channel 11, a source/drain pair 12, and a gate structure 20. The channel 11 may be provided in or on the substrate 10. In some embodiments, the channel 11 may be formed from the substrate 10, that is, a part of the substrate 10. In another embodiment, the channel 11 may be formed on the substrate 10 and may not be a part of the substrate 10. The channel 11 may include a semiconductor material that is the same as or different from that of the substrate 10. When the transistor TR is n-type, the channel 11 may include a semiconductor material doped with p-type impurities. When the transistor TR is a p-type transistor, the channel 11 may include a semiconductor material doped with n-type impurities.

The source/drain pair 12 may be at opposite ends of the channel 11. The source/drain pair 12 may be formed in or on the substrate 10. In some embodiments, the source/drain 12 may be formed from the substrate 10, that is, a part of the substrate 10. In another embodiment, the source/drain 12 may be formed on the substrate 10 and may not be a part of the substrate 10. The source/drain 12 may include a semiconductor material that is the same as or different from that of the substrate 10. When the transistor TR is n-type, the source/drain 12 may include a semiconductor material doped with n-type impurities. When the transistor TR is a p-type transistor, the source/drain 12 may include a semiconductor material doped with p-type impurities.

The gate structure 20 may include an interfacial layer 21, a ferroelectric layer 22, and a stabilization layer 23 that are sequentially stacked on the channel 11. In some embodiments, the interfacial layer 21 may be directly on the channel 11 without an arbitrary additional layer. The interfacial layer 21 may include, for example, silicon oxide, silicon nitride, or a combination thereof such as silicon oxynitride, but is not limited thereto. The interfacial layer 21 may have a thickness of about 1 Å to about 10 Å. When the thickness of the interfacial layer 21 is greater than 10 Å, an equivalent oxide thickness (EOT) increases, thereby degrading characteristics of the semiconductor device 100. On the contrary, when the interfacial layer 21 has a thickness less than 1 Å, a leakage current may increase.

The ferroelectric layer 22 and the interfacial layer 21 may function as gate insulating layers of the gate structure 20 in the transistor TR. In some embodiments, the ferroelectric layer 22 may be directly on the interfacial layer 21 without an intervening layer therebetween. The ferroelectric layer 22 may show a ferroelectric property. The ferroelectric layer 22 includes a ferroelectric material. The ferroelectric material may exhibit ferroelectricity only when having a phase of a certain crystal structure, and in the specification, the phase is referred to as a ferroelectric phase. The ferroelectric layer 22 may include $HfO_2$, doped $HfO_2$ (for example, Si-doped $HfO_2$, or Al-doped $HfO_2$), $ZrO_2$, doped $ZrO_2$ (for example, Li-doped $ZrO_2$, or Mg-doped $ZrO_2$), $Hf_xZr_{1-x}O_2$ ($0<x<1$), $ATiO_3$ (A is Ba, Sr, Ca, or Pb), or a combination thereof, but is not limited thereto.

In some embodiments, the stabilization layer 23 may be directly on the ferroelectric layer 22 without any intervening layer therebetween. The stabilization layer 23 may stabilize the ferroelectric phase in the ferroelectric layer 22. For example, the stabilization layer 23 may help the ferroelectric phase be formed in the ferroelectric layer 22 while annealing the ferroelectric layer 22. Also, for example, the stabilization layer 23 prevents the ferroelectric phase in the ferroelectric layer 22 from being vanished during a post-process (e.g., high temperature process) after the annealing, and thus prevents the ferroelectric layer 22 from losing the ferroelectricity. In the specification, prevention of a certain effect may include at least partially reducing a certain effect, as well as complete elimination of the effect. In some embodiments, the stabilization layer 23 may stabilize the ferroelectric phase by affecting an internal stress of the ferroelectric layer 22. For example, the stabilization layer 23 may stabilize the ferroelectric phase in the ferroelectric layer 22 by placing the ferroelectric layer 22 under a large tensile stress or a large compressive stress.

In some embodiments, the stabilization layer 23 may include a material having a relatively large thermal expansion coefficient. The stabilization layer 23 may include, for example, TiN, MoN, Mo, $Al_2O_3$, AlN, W, WN, WCN, La, LaO, LaN, TiAlN, TiON, or a combination thereof, but is not limited thereto. The stabilization layer 23 may have a thickness of about 1 Å to about 30 Å, for example, about 5 Å to about 20 Å, but is not limited thereto. When the stabilization layer 23 includes a material having a large work function such as MoN and the transistor TR is a p-type transistor, a threshold voltage of the transistor TR may be easily controlled. On the contrary, when the stabilization layer 23 includes a material having a relatively small work function and the transistor TR is an n-type transistor, the threshold voltage of the transistor TR may be easily controlled.

In some embodiments, the gate structure 20 may further include an oxygen diffusion barrier layer 24. The oxygen diffusion barrier layer 24 may be on the stabilization layer 23. The oxygen diffusion barrier layer 24 may prevent the oxygen from being diffused into the interfacial layer 21 in order to prevent an increase in the thickness of the interfacial layer 21 while annealing the ferroelectric layer 22. The oxygen diffusion barrier layer 24 may include, for example, TiN, AlN, TaN, TiSiN, TiON, TiAlN, WCN, WN, W, or a combination thereof, but is not limited thereto. The oxygen diffusion barrier layer 24 may have a thickness of about 1 Å to about 30 Å, for example, about 5 Å to about 20 Å, but is not limited thereto.

In some embodiments, the gate structure 20 may further include a threshold voltage control layer 25. The threshold voltage control layer 25 may be on the oxygen diffusion barrier layer 24. The threshold voltage control layer 25 may control the threshold voltage of the transistor TR. In some embodiments, the threshold voltage control layer 25 may include a material that is different from that of the stabilization layer 23. When the transistor TR is a p-type transistor, the threshold voltage control layer 25 may include a material having a relatively large work function. For example, the threshold voltage control layer 25 may include Ti, W, Mo, Al, Si, a compound of at least one thereof and at least one another thereof, or a combination thereof, but is not limited thereto. When the transistor TR is an n-type transistor, the threshold voltage control layer 25 may include a material having a relatively small work function. For example, the threshold voltage control layer 25 may include Ti, Al, Ta, V, Nb, Si, a compound of these elements, or a combination thereof, but is not limited thereto. In some embodiments, the threshold voltage control layer 25 may include TiN. The threshold voltage control layer 25 may have a thickness of about 10 Å to about 60 Å, but is not limited thereto. In some embodiments, the threshold voltage of the transistor TR may be affected by the stabilization layer 23 and the oxygen diffusion barrier layer 24, as well as the threshold voltage control layer 25. In some embodiments, the work function of the material included in the stabilization layer 23 may be greater than that of the material included in the threshold voltage control layer 25.

In some embodiments, the threshold voltage control layer 25 may include a lower threshold voltage control layer 25a on the oxygen diffusion barrier layer 24 and an upper threshold voltage control layer 25b on the lower threshold voltage control layer 25a. In some embodiments, a work function of a material included in the lower threshold voltage control layer 25a may be greater than a work function of a material included in the upper threshold voltage control layer 25b. In some embodiments, the lower threshold voltage control layer 25a includes TiN and the upper threshold voltage control layer 25b includes TiAlC, but are not limited thereto. In some embodiments, the work function of the material included in the stabilization layer 23 may be greater than that of the material included in the upper threshold voltage control layer 25b. In some embodiments, the work function of the material included in the stabilization layer 23 may be greater than that of the material included in the lower threshold voltage control layer 25a.

In some embodiments, the gate structure 20 may further include an upper barrier layer 26. The upper barrier layer 26 may be on the threshold voltage control layer 25. The upper barrier layer 26 may include TiN, TaN, or a combination thereof, but is not limited thereto. In some embodiments, the gate structure 20 may further include a gate filling layer 27. The gate filling layer 27 may include, for example, W, but is not limited thereto.

In some embodiments, the semiconductor device 100 may further include a device isolation layer 13, such as a shallow trench isolation (STI) layer. The device isolation layer 13 may be formed in or on the substrate 10. The device isolation layer 13 may include, for example, silicon oxide, silicon nitride, or a combination thereof, but is not limited thereto. The device isolation layer 13 may include a single-layered or multi-layered structure.

In some embodiments, the semiconductor device 100 may further include gate spacers 30 on opposite side walls of the gate structure 20. The gate spacer 30 may include, for example, silicon oxide, silicon nitride, or a combination thereof, but is not limited thereto.

In some embodiments, the semiconductor device 100 may further include an interlayer insulating layer 40. The interlayer insulating layer 40 may fill a space from an upper surface of the substrate 10 to a height of the upper end of the gate structure 20. The interlayer insulating layer 40 may cover the source/drain pair 12, the device isolation layer 13, and sidewalls of the gate spacers 30.

The semiconductor device 100 according to the embodiment may include the ferroelectric layer 22 having an improved ferroelectric property by including the stabilization layer 23. Therefore, the transistor TR of the semiconductor device 100 according to the embodiment may have a relatively small subthreshold swing. For example, the semiconductor device 100 may have a subthreshold swing less than 60 mV/dec that is a theoretical limit. Also, the semiconductor device 100 according to the embodiment may include the oxygen diffusion barrier layer 24 to prevent the thickness of the interfacial layer 21 from increasing during the annealing of the ferroelectric layer 22. Therefore, the increase in the thickness of the EOT of the gate structure 20 in the transistor TR of the semiconductor device 100 may be prevented according to the embodiment.

Figure 2A:
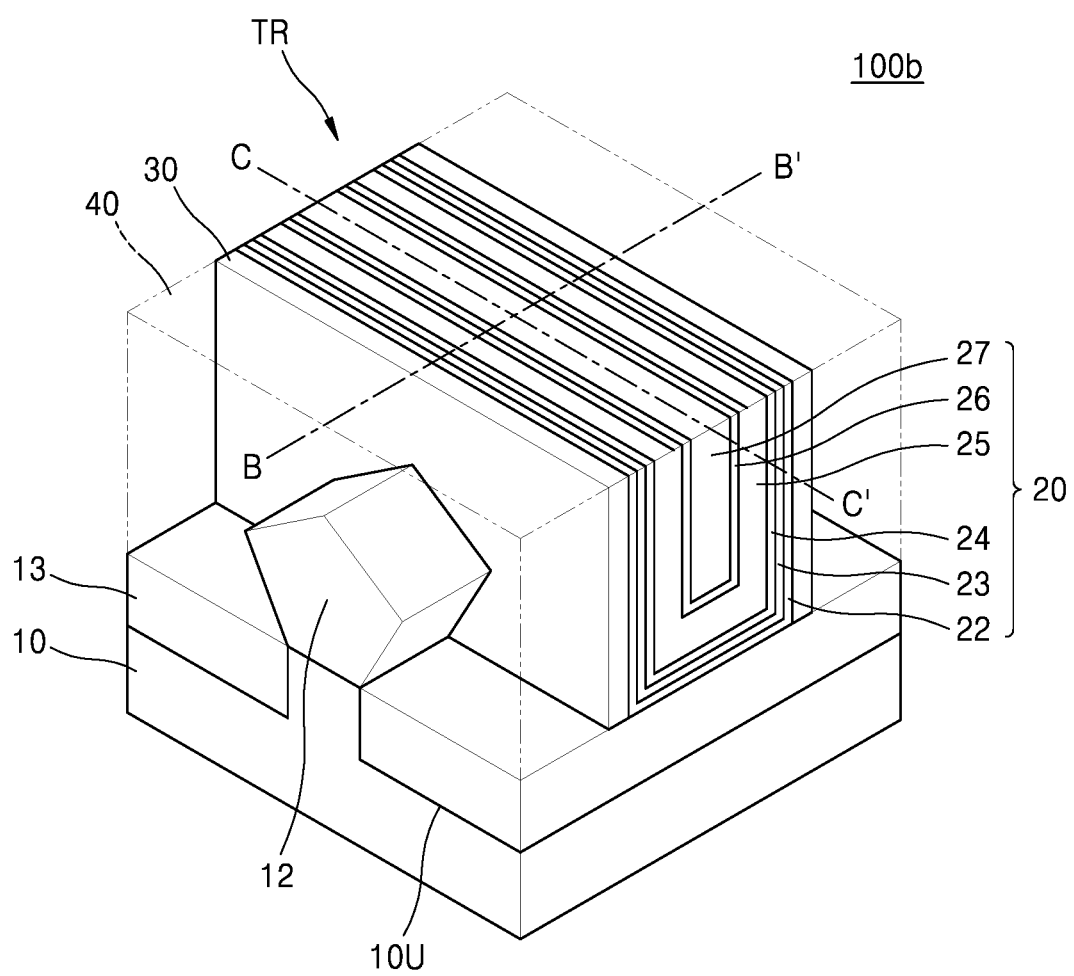
FIG. 2A is a perspective view of a semiconductor device according to an embodiment.
Figure 2B:
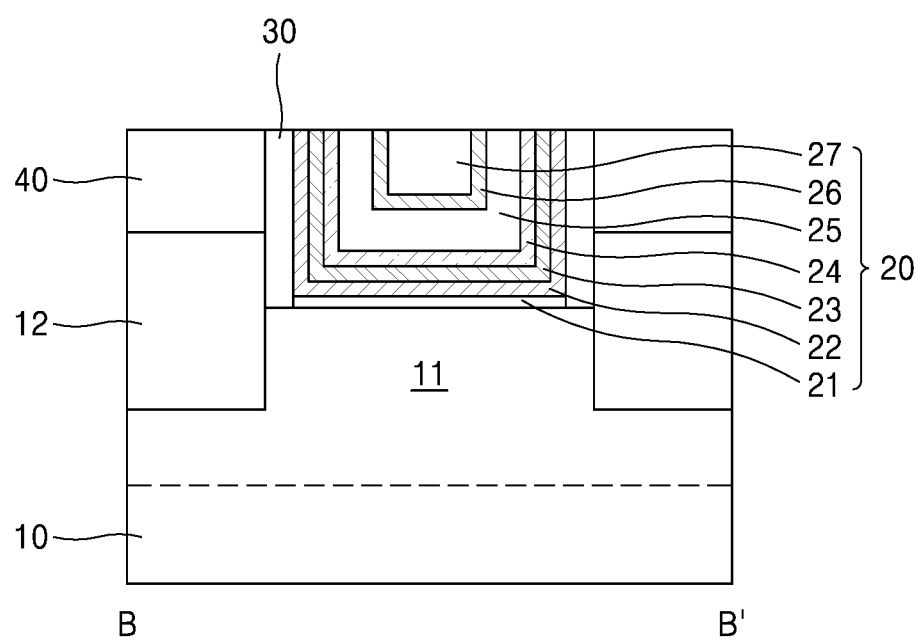
FIGS. 2B and 2C are cross-sectional views of a semiconductor device taken along line BB' and line CC' of FIG. 2A, according to an embodiment.
Figure 2C:
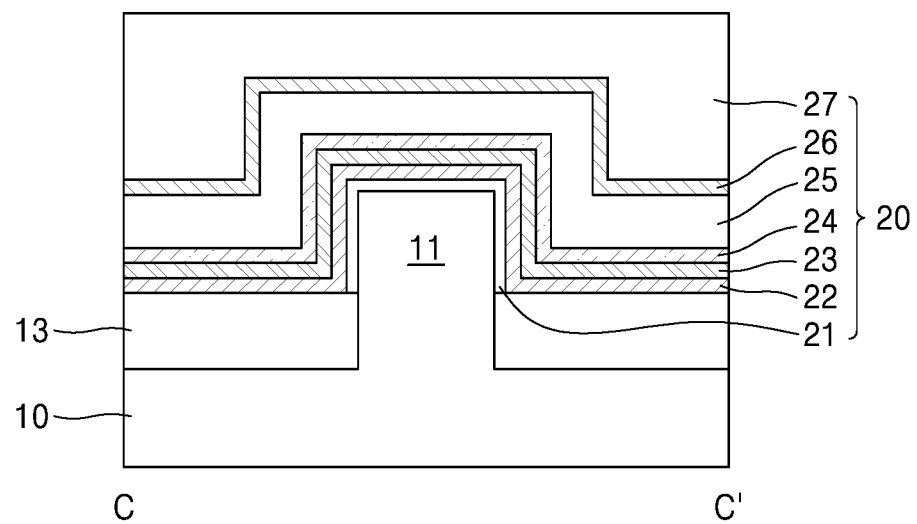

FIG. 2A is a perspective view of a semiconductor device 100b according to an embodiment. FIGS. 2B and 2C are cross-sectional views of the semiconductor device 100b taken along line BB' and line CC' of FIG. 2A, according to the embodiment. Hereinafter, differences between the semiconductor device 100 of FIG. 1 and the semiconductor device 100b of FIGS. 2A to 2C will be described below. Referring to FIGS. 2A to 2C, the transistor TR may be a fin-type field-effect transistor (FinFET). That is, the channel 11 of the transistor TR may have a fin shape protruding from an upper surface 10U of the substrate 10. Therefore, the gate structure 20 may be in contact with an upper surface and opposite side surfaces of the channel 11.

Figure 3:
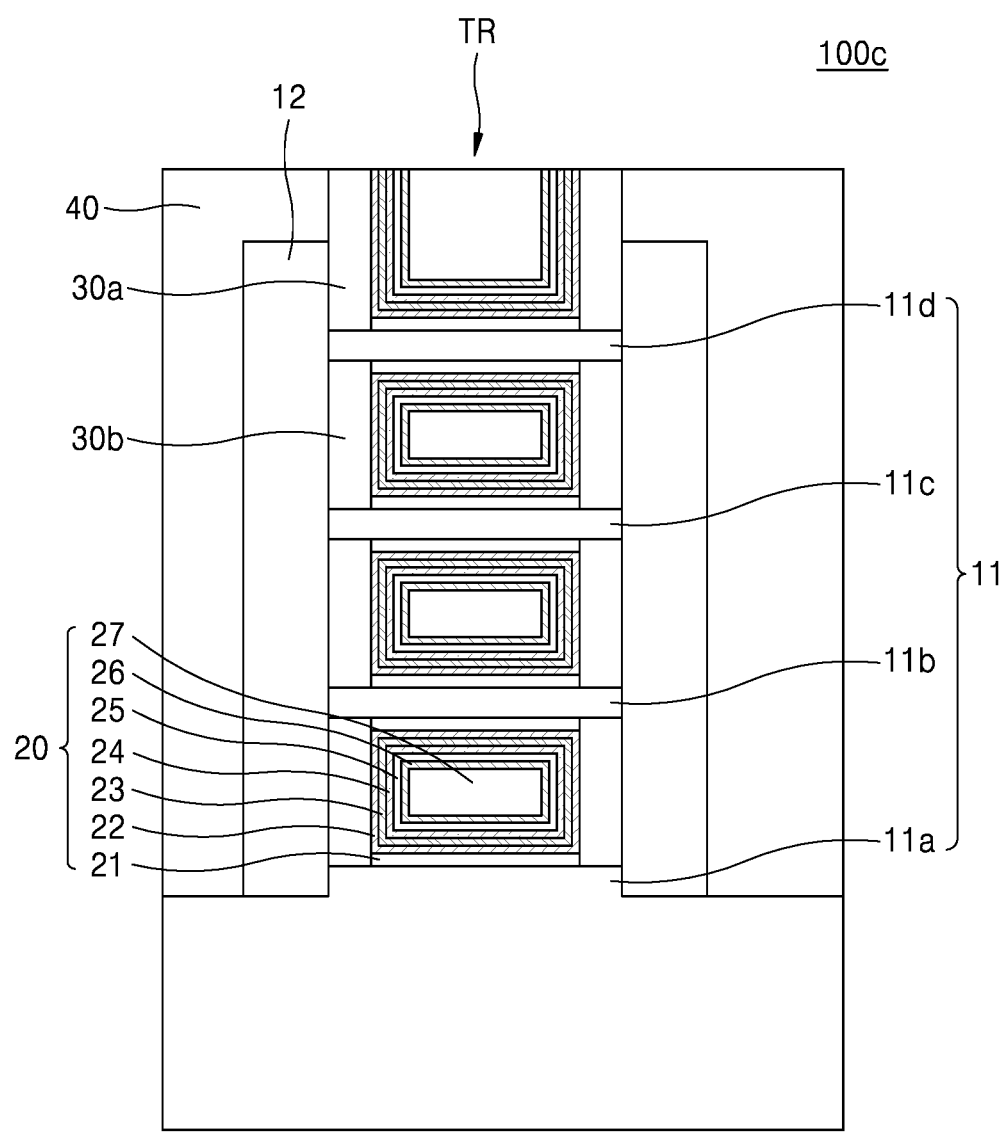
FIG. 3 is a cross-sectional view of a semiconductor device according to an embodiment.

FIG. 3 is a cross-sectional view of a semiconductor device 100c according to an embodiment. Hereinafter, differences between the semiconductor device 100 of FIG. 1 and the semiconductor device 100c of FIG. 3 will be described below. Referring to FIG. 3, the transistor TR may be a gate all-around field-effect transistor (GAAFET) or a multi-bridge channel field-effect transistor (MBCFET). The channel 11 may include a plurality of portions 11a to 11d apart from one another in a vertical direction. The plurality of portions 11b to 11d of the channel 11 may each have a nano-wire shape or a nano-sheet shape. The gate structure 20 may surround an upper surface of a lowermost portion (11a) of the channel 11 and upper surfaces, lower surfaces, and opposite side surfaces (not shown) of each of the other portions 11b to 11d of the channel 11. The interfacial layer 21, the ferroelectric layer 22, the stabilization layer 23, the oxygen diffusion barrier layer 24, the threshold voltage control layer 25, the upper barrier layer 26, and the gate filling layer 27 may be sequentially stacked on the upper portion of the lowermost portion 11a of the channel 11 and on the upper surface, lower surface, and opposite side surfaces (not shown) of each of the other portions 11b to 11d of the channel 11.

One of the source/drain 12 may be commonly in contact with ends of the portions 11a to 11d of the channel 11. The other of the source/drain 12 may be commonly in contact with opposite ends of the portions 11a to 11d of the channel 11.

First gate spacers 30a may be on opposite upper side walls of the gate structure 20, which are higher than the uppermost portion 11d of the channel 11. Second gate spacers 30b may be on opposite lower side walls of the gate structure 20, which are lower than the uppermost portion 11d of the channel 11. Each of the first and second gate spacers 30a and 30b may include, for example, silicon oxide, silicon nitride, or a combination thereof, but is not limited thereto.

Figure 4A:
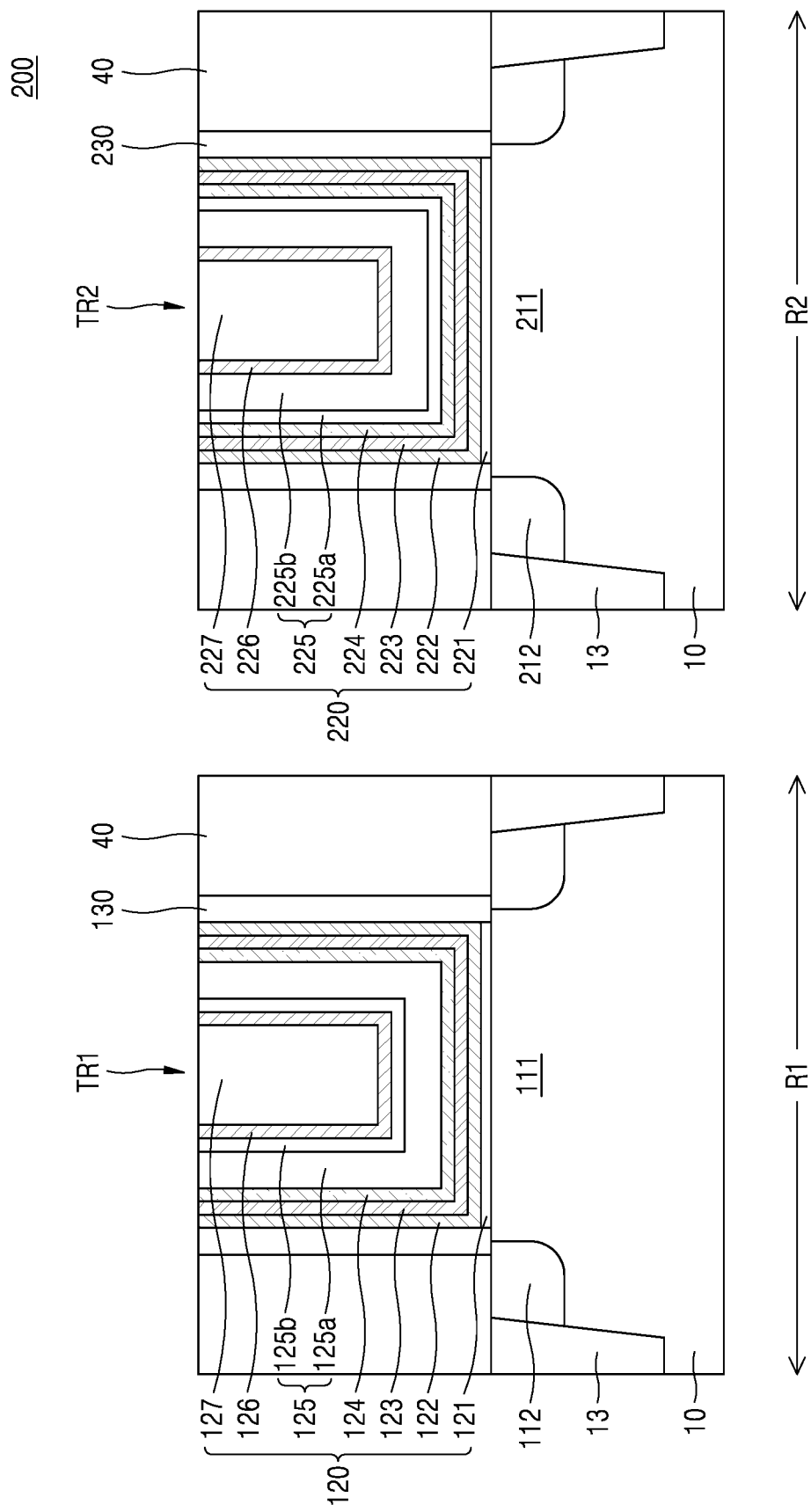
FIGS. 4A to 4E are cross-sectional views of semiconductor devices according to one or more embodiments.
Figure 4B:
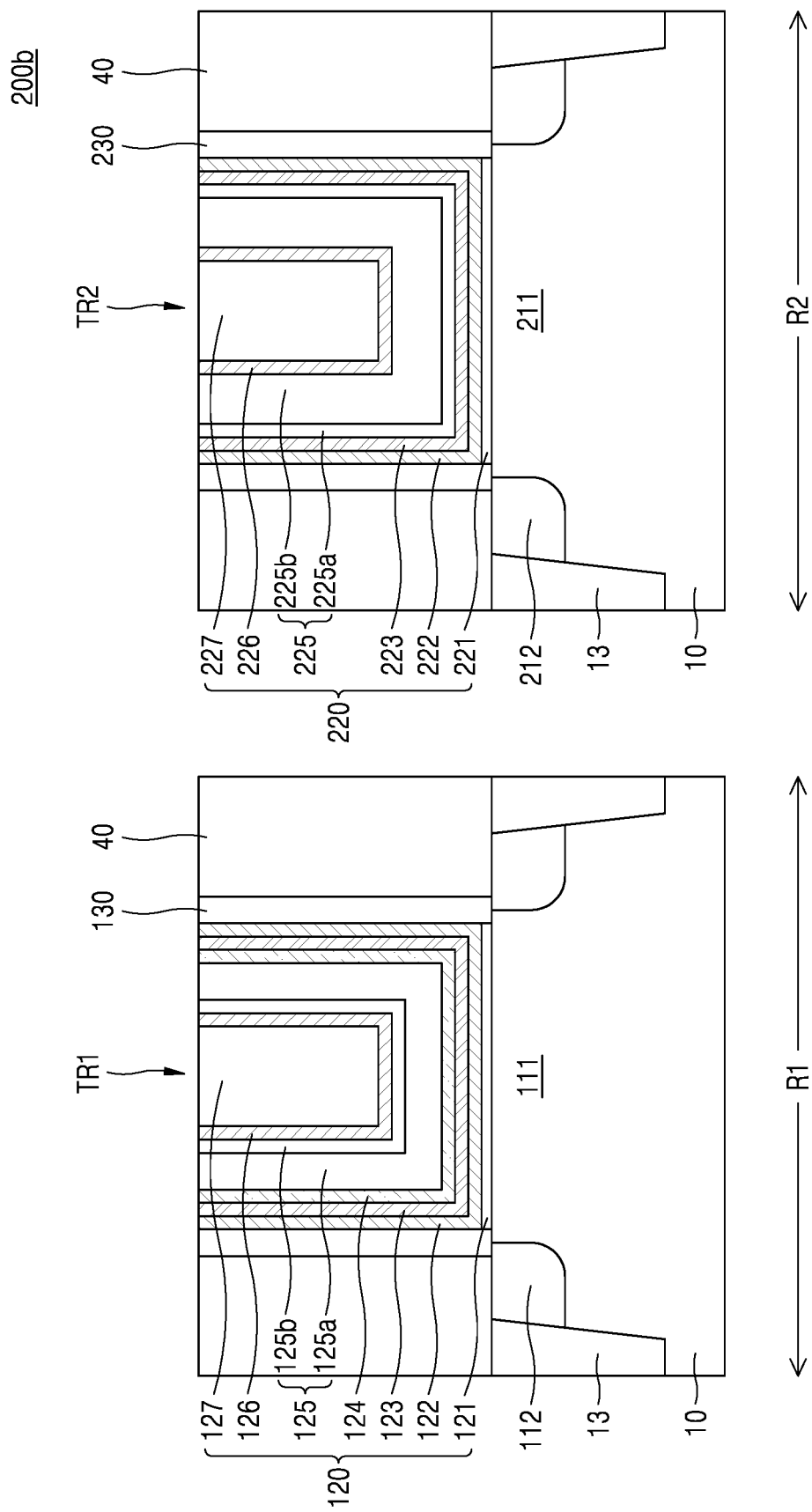
Figure 4C:
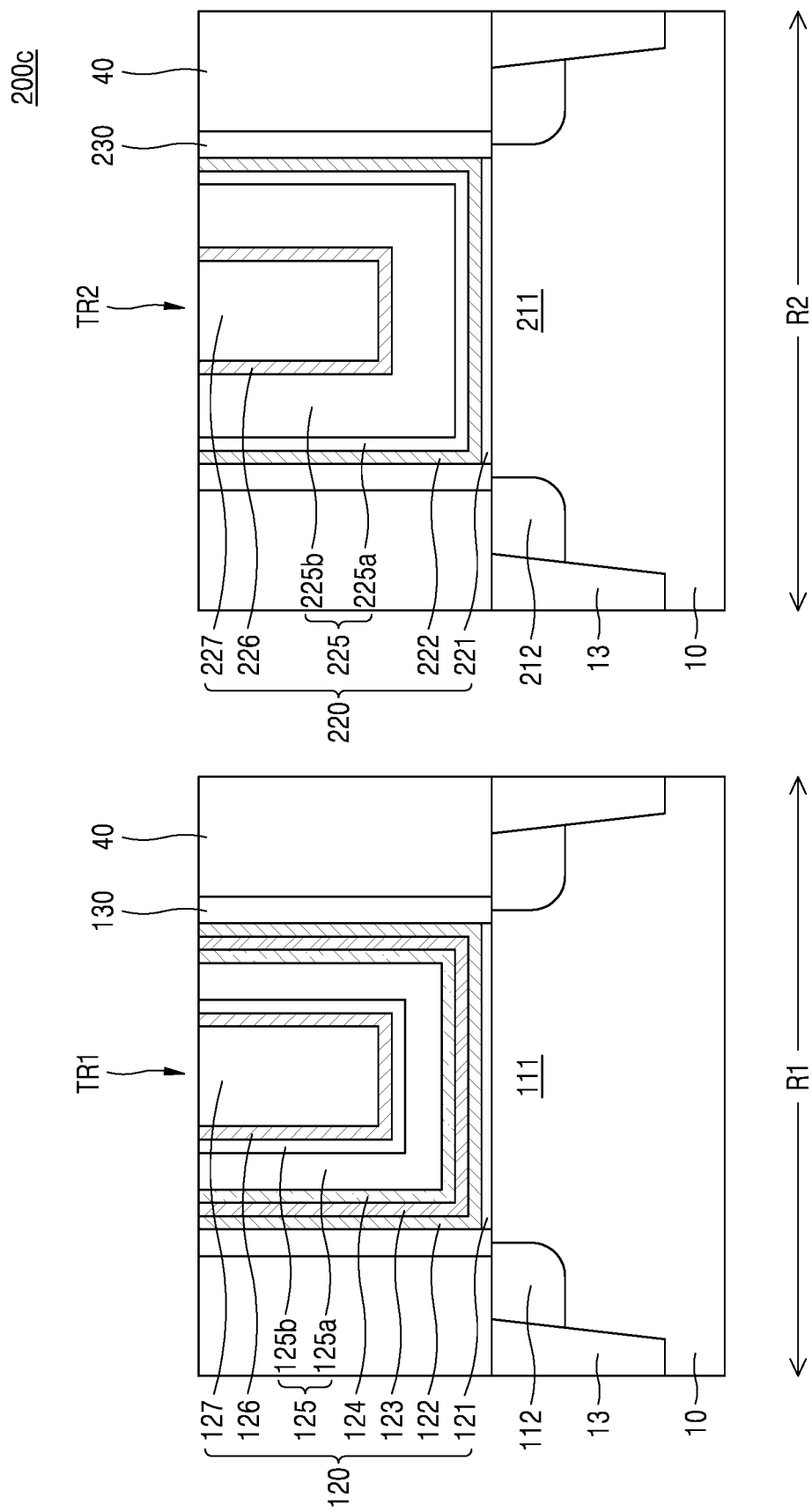

FIGS. 4A to 4C are cross-sectional views of semiconductor devices 200 and 200b to 200e according to one or more embodiments. Referring to FIG. 4A, the semiconductor device 200 may include the substrate 10, a first transistor TR1, and a second transistor TR2. The substrate 10 may include a first region R1 and a second region R2. The first transistor TR1 may be on the first region R1 of the substrate 10, and the second transistor TR2 may be on the second region R2 of the substrate 10. Each of the first transistor TR1 and the second transistor TR2 may be one of the transistors TR shown in FIGS. 1 to 3. In some embodiments, the first transistor TR1 and the second transistor TR2 may be respectively p-type and n-type transistors.

The first transistor TR1 may include a first channel 111, a first source/drain pair 112, and a first gate structure 120. The second transistor TR2 may include a second channel 211, second source/drain 212, and a second gate structure 220. The first channel 111 and the second channel 211 may be the same as the channel 11 described above with reference to FIGS. 1 to 3. The first channel 111 and the second channel 211 may include semiconductor materials that are the same as or different from each other. Each of the first source/drain 112 and the second source/drain 212 is the same as the source/drain 12 described above with reference to FIGS. 1 to 3. In some embodiments, the first source/drain 112 and the second source/drain 212 may include semiconductor materials that are different from each other. For example, the first source/drain 112 may include Si—Ge, whereas the second source/drain 212 may include Si.

The first gate structure 120 may include a first interfacial layer 121, a first ferroelectric layer 122, a first stabilization layer 123, a first oxygen diffusion barrier layer 124, a first threshold voltage control layer 125, a first upper barrier layer 126, and a first gate filling layer 127 that are sequentially stacked on the first channel 111. In some embodiments, at least one of the first threshold voltage control layer 125, the first upper barrier layer 126, and the first gate filling layer 127 may be omitted.

The second gate structure 220 may include a second interfacial layer 221, a second ferroelectric layer 222, a second stabilization layer 223, a second oxygen diffusion barrier layer 224, a second threshold voltage control layer 225, a second upper barrier layer 226, and a second gate filling layer 227 that are sequentially stacked on the second channel 211. In some embodiments, at least one of the second threshold voltage control layer 225, the second upper barrier layer 226, and the second gate filling layer 227 may be omitted.

Each of the first interfacial layer 121 and the second interfacial layer 221 may be the same as the interfacial layer 21 described above with reference to FIGS. 1 to 3. In some embodiments of the invention, the first interfacial layer 121 and the second interfacial layer 221 may include the same material as each other. In some other embodiments, the first interfacial layer 121 and the second interfacial layer 221 may have substantially the same thickness as each other. In the specification, the specification that a first thickness and a second thickness are substantially the same as each other denotes that a difference between the first thickness and the second thickness is equal to or less than 10% of the first thickness or the second thickness.

Each of the first ferroelectric layer 122 and the second ferroelectric layer 222 may be the same as the ferroelectric layer 22 described above with reference to FIGS. 1 to 3. In some embodiments, the first ferroelectric layer 122 and the second ferroelectric layer 222 may include the same material as each other. In other embodiments, the first ferroelectric layer 122 and the second ferroelectric layer 222 may have substantially the same thickness as each other.

Each of the first stabilization layer 123 and the second stabilization layer 223 may be the same as the stabilization layer 23 described above with reference to FIGS. 1 to 3. In some embodiments, the first stabilization layer 123 and the second stabilization layer 223 may include the same material as each other. The above material may be MoN, but is not limited thereto. In some embodiments, the first stabilization layer 123 and the second stabilization layer 223 may have substantially the same thickness as each other.

Each of the first oxygen diffusion barrier layer 124 and the second oxygen diffusion barrier layer 224 may be the same as the oxygen diffusion barrier layer 24 described above with reference to FIGS. 1 to 3. In some embodiments, the first oxygen diffusion barrier layer 124 and the second oxygen diffusion barrier layer 224 may include the same material as each other. In some embodiments, the first oxygen diffusion barrier layer 124 and the second oxygen diffusion barrier layer 224 may have substantially the same thickness as each other.

Each of the first threshold voltage control layer 125 and the second threshold voltage control layer 225 may be the same as the threshold voltage control layer 25 described above with reference to FIGS. 1 to 3. In some embodiments, the first threshold voltage control layer 125 and the second threshold voltage control layer 225 may include different materials from each other.

In some additional embodiments, the first threshold voltage control layer 125 may include a first lower threshold voltage control layer 125a and a first upper threshold voltage control layer 125b, and the second threshold voltage control layer 225 may include a second lower threshold voltage control layer 225a and a second upper threshold voltage control layer 225b. In some embodiments, the first lower threshold voltage control layer 125a and the second lower threshold voltage control layer 225a may include the same material as each other, but have different thicknesses from each other. The above material may be, for example, TiN, but is not limited thereto. For example, the first lower threshold voltage control layer 125a may have a thickness greater than that of the second lower threshold voltage control layer 225a. In some further embodiments, the first upper threshold voltage control layer 125b and the second upper threshold voltage control layer 225b may include the same material as each other. The above material may be, for example, TiAlC, but is not limited thereto. The first upper threshold voltage control layer 125b and the second upper threshold voltage control layer 225b may have the same thickness as or different thicknesses from each other.

Each of the first upper barrier layer 126 and the second upper barrier layer 226 may be the same as the upper barrier layer 26 described above with reference to FIGS. 1 to 3. In some embodiments, the first upper barrier layer 126 and the second upper barrier layer 226 may include the same material as each other. The above material may be, for example, TiN, but is not limited thereto. In some further embodiments, the first upper barrier layer 126 and the second upper barrier layer 226 may have an equal thickness, however, unequal thicknesses are also possible.

Each of the first gate filling layer 127 and the second gate filling layer 227 may be the same as the gate filling layer 27 described above with reference to FIGS. 1 to 3. In some embodiments, the first gate filling layer 127 and the second gate filling layer 227 may include the same material. The above material may be W, but is not limited thereto. The first gate filling layer 127 and the second gate filling layer 227 may have the same thickness as or different thicknesses from each other.

The semiconductor device 200 may further include first gate spacers 130 on side walls of the first gate structure 120 and second gate spacers 230 on side walls of the second gate structure 220. Each of the first and second gate spacers 130 and 230 may be the same as the gate spacer 30 described above with reference to FIGS. 1 to 3. In some embodiments, the first and second gate spacers 130 and 230 may have the same materials as each other.

The device isolation layer 13 may electrically isolate the first transistor TR1 and the second transistor TR2 from each other. The interlayer insulating layer 40 may fill a space from the upper surface of the substrate 10 to a height of upper ends of the first gate structure 120 and the second gate structure 220. The interlayer insulating layer 40 may cover the first source/drain pair 112, the second source/drain pair 212, the device isolation layer 13, side walls of the first gate spacers 130, and side walls of the second gate spacers 230.

Referring to FIG. 4B, the first transistor TR1 includes both the first stabilization layer 123 and the first oxygen diffusion barrier layer 124, but the second transistor TR2 may include the second stabilization layer 223 and may not include the second oxygen diffusion barrier layer 224 (see FIG. 4A). That is, the second threshold voltage control layer 225 may be directly on the second stabilization layer 223. The second transistor TR2 may not include the second oxygen diffusion barrier layer 224 (see FIG. 4A) for controlling the threshold voltage of the second transistor TR2. For example, when the first transistor TR1 is a p-type transistor and the second transistor TR2 is an n-type transistor (e.g., CMOS device application), and the second oxygen diffusion barrier layer 224 (see FIG. 4A) includes a material having a relatively high work function, the second transistor TR2 may not include the second oxygen diffusion barrier layer 224 (see FIG. 4A) for controlling the threshold voltage.

Referring to FIG. 4C, the first transistor TR1 includes both the first stabilization layer 123 and the first oxygen diffusion barrier layer 125, but the second transistor TR2 may include neither of the second stabilization layer 223 (see FIG. 4A) and the second oxygen diffusion barrier layer 224 (see FIG. 4A). That is, the second threshold voltage control layer 225 may be directly on the second ferroelectric layer 222. The second transistor TR2 may not include the second stabilization layer 223 (see FIG. 4A) for controlling the threshold voltage of the second transistor TR2. For example, when the first transistor TR1 is a p-type transistor, the second transistor TR2 is an n-type transistor, and the second stabilization layer 223 (see FIG. 4A) includes a material having a relatively high work function, the second transistor TR2 may not include the second stabilization layer 223 (see FIG. 4A) for controlling the threshold voltage.

Figure 4D:
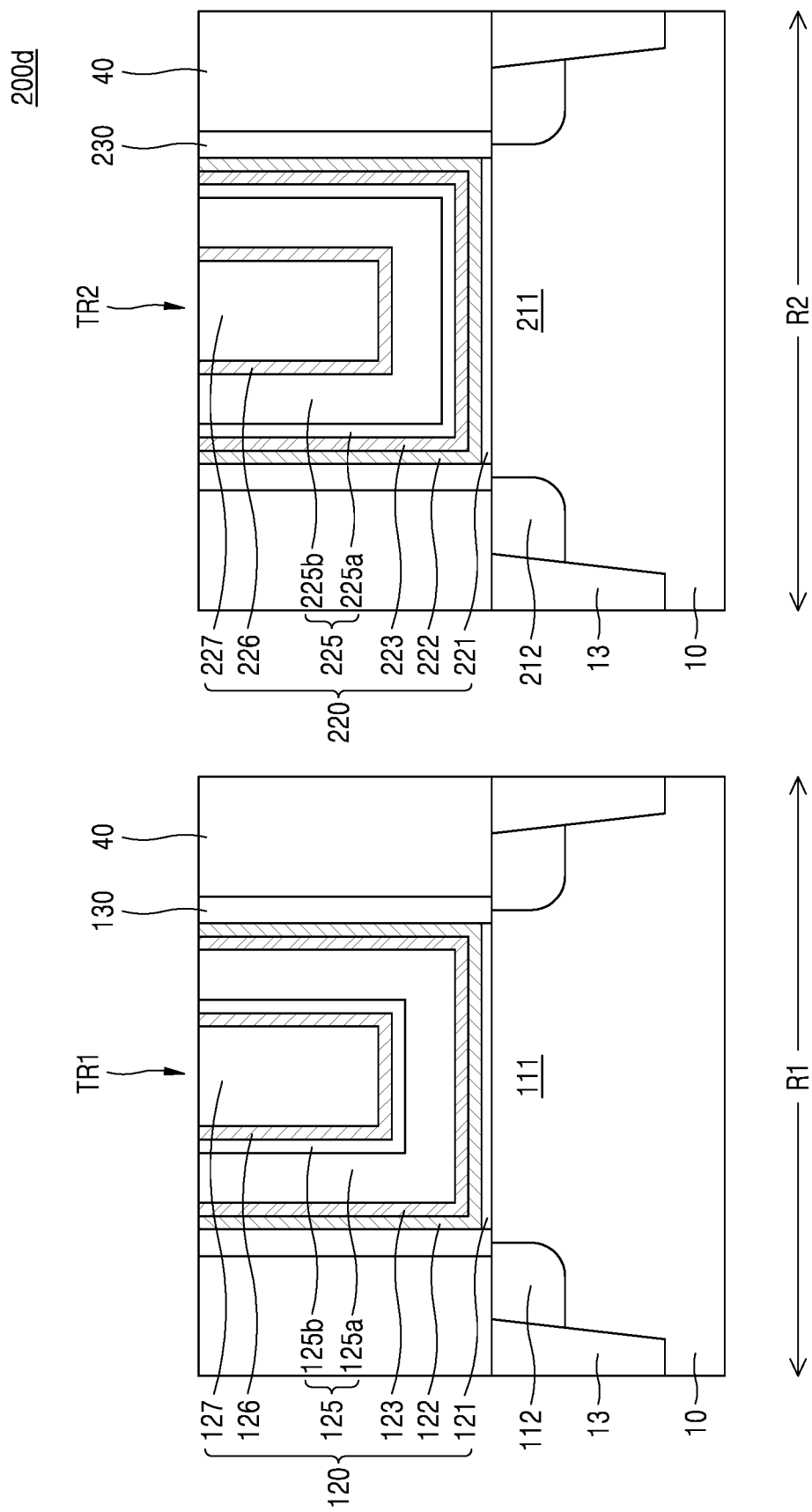

Referring to FIG. 4D, the first transistor TR1 may not include the first oxygen diffusion barrier layer 124 (see FIG. 4A) and the second transistor TR2 may omit the second oxygen diffusion barrier layer 224 (see FIG. 4A). That is, the first threshold voltage control layer 125 may be directly on the first stabilization layer 123 and the second threshold voltage control layer 225 may be directly on the second stabilization layer 223.

Figure 4E:
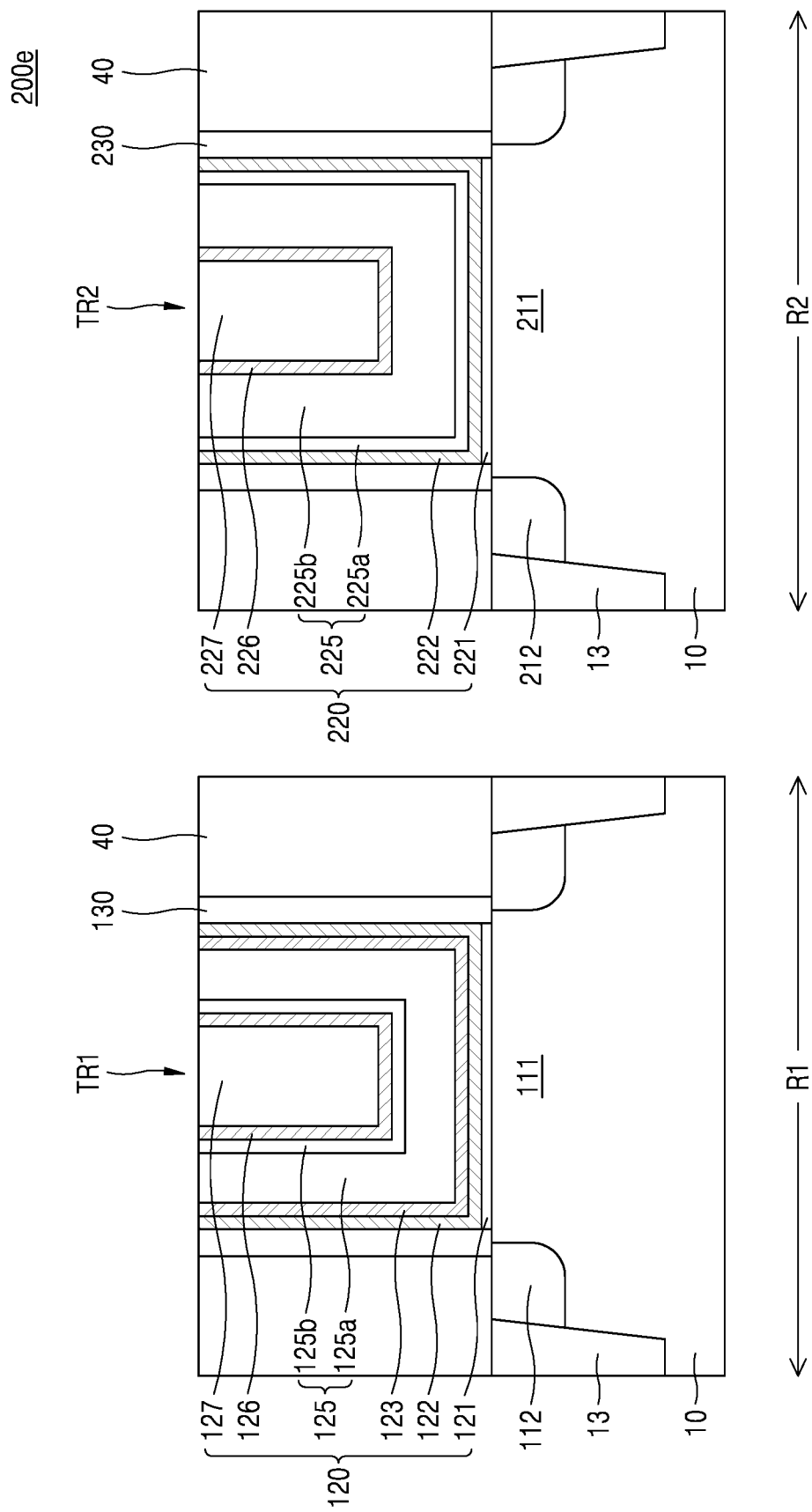

Referring to FIG. 4E, the first transistor TR1 may include the first stabilization layer 123 and may not include the first oxygen diffusion barrier layer 124 (see FIG. 4A), and the second transistor TR2 may not include the second stabilization layer 223 (see FIG. 4A) and the second oxygen diffusion barrier layer 224 (see FIG. 4A). That is, the first threshold voltage control layer 125 may be directly on the first stabilization layer 123 and the second threshold voltage control layer 225 may be directly on the second ferroelectric layer 222. For example, when the first transistor TR1 is a p-type transistor, the second transistor TR2 is an n-type transistor, and the second stabilization layer 223 (see FIG. 4A) includes a material having a relatively high work function, the second transistor TR2 may not require the second stabilization layer 223 (see FIG. 4A) in order to adequately control the threshold voltage of the n-type transistor.

Figure 5:
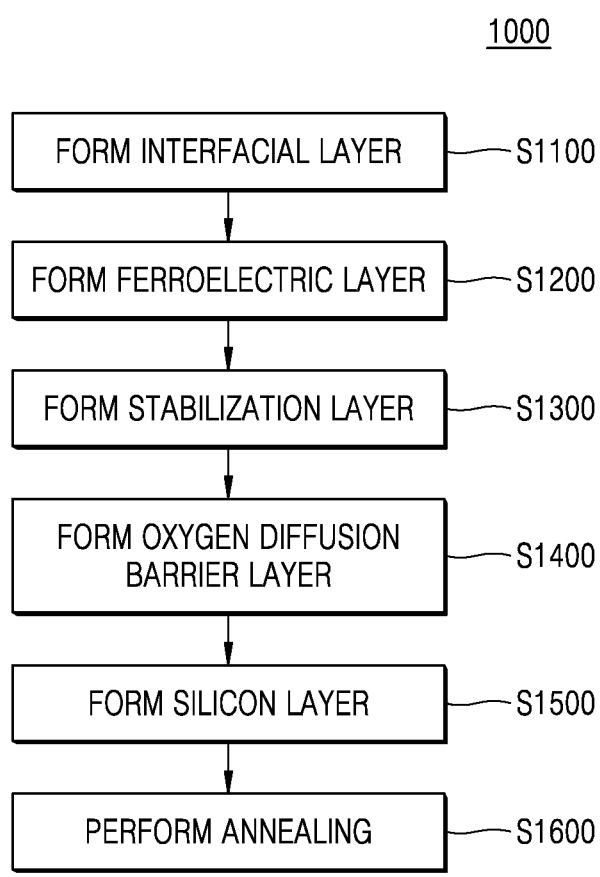
FIG. 5 is a flowchart illustrating a method of manufacturing a semiconductor device, according to an embodiment.
Figure 6A:
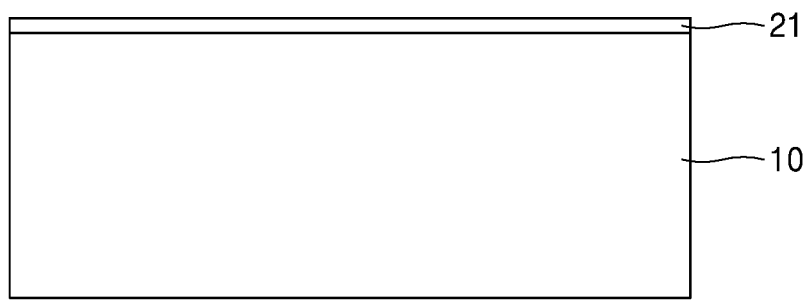
FIGS. 6A to 6E are diagrams illustrating a method of manufacturing a semiconductor device, according to an embodiment.

FIG. 5 is a flowchart illustrating a method (1000) of manufacturing a semiconductor device, according to an embodiment. FIGS. 6A to 6E are diagrams illustrating a method (1000) of manufacturing a semiconductor device, according to an embodiment. Referring to FIGS. 5 and 6A, the interfacial layer 21 may be formed on the substrate 10. The interfacial layer 21 as formed may have a thickness of about 1 Å to about 8 Å. The interfacial layer 21 may be formed by, for example, native oxidation, thermal oxidation, or atomic layer deposition (ALD) (S1100). In some embodiments, the interfacial layer 21 may be formed together with the ferroelectric layer 22 when the ferroelectric layer 22 is formed (S1200).

Figure 6B:
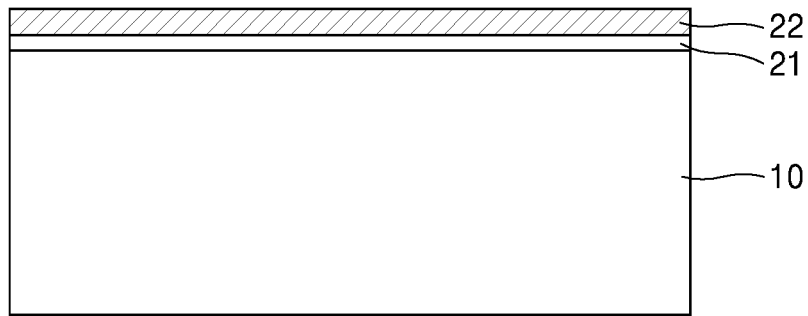
Figure 6C:
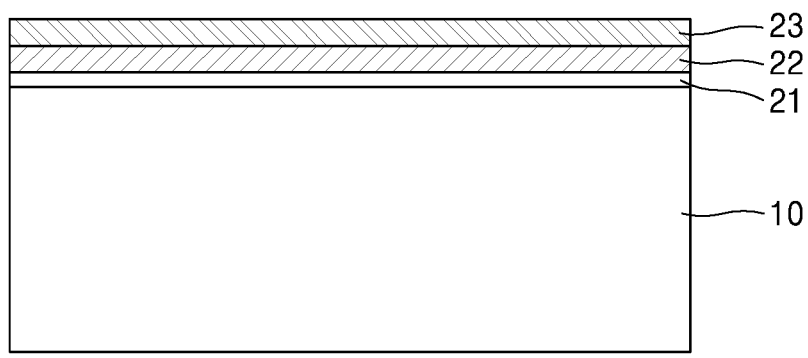

Referring to FIGS. 5 and 6B, the ferroelectric layer 22 may be formed on the interfacial layer 21 (S1200). The ferroelectric layer 22 may be formed by, for example, atomic layer deposition (ALD). The ferroelectric layer 22 may not have the ferroelectric phase or only a small portion of the ferroelectric layer 22 may have the ferroelectric phase. Therefore, the ferroelectric layer 22 may not exhibit ferroelectricity or only exhibits relatively little ferroelectricity. Referring to FIGS. 5 and 6C, the stabilization layer 23 may be formed on the ferroelectric layer 22 (S1300). The stabilization layer 23 may be formed by, for example, chemical vapor deposition (CVD), physical vapor deposition (PVD), ALD, or a combination thereof.

Figure 6D:
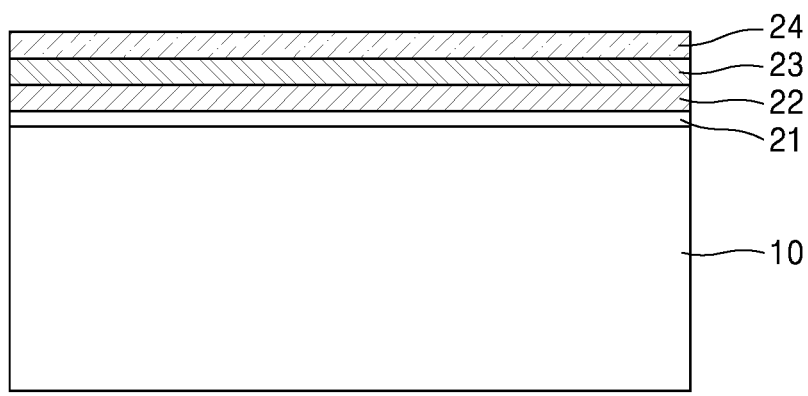

Referring to FIGS. 5 and 6D, the oxygen diffusion barrier layer 24 may be formed on the stabilization layer 23 (S1400). The oxygen diffusion barrier layer 24 may be formed by, for example, CVD, PVD, ALD, or a combination thereof.

Figure 6E:
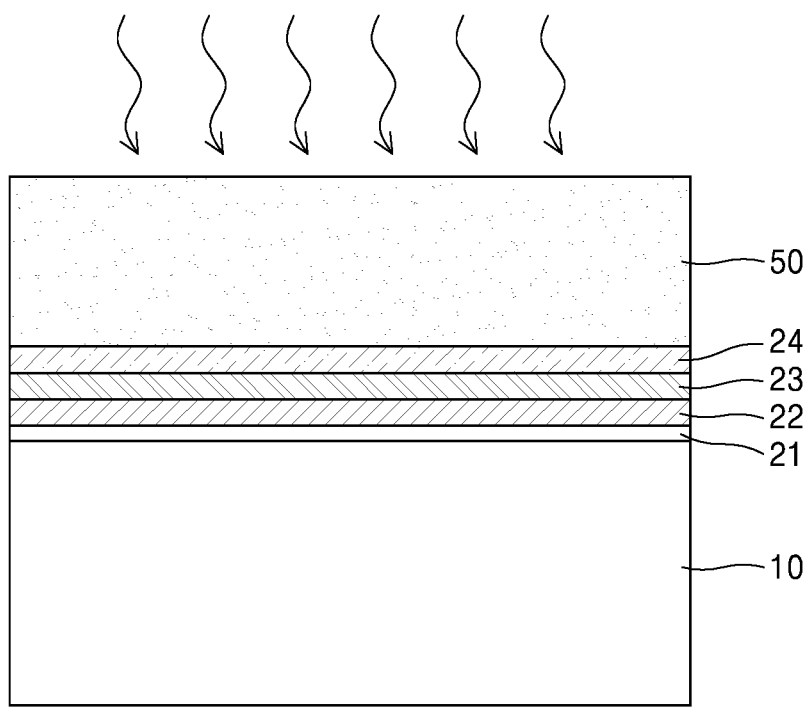

Referring to FIGS. 5 and 6E, a silicon layer 50 may be formed on the oxygen diffusion barrier layer 24 (S1500). The silicon layer 50 may be formed by, for example, CVD, PVD, ALD, or a combination thereof. After that, the ferroelectric layer 22 may be annealed. For example, the ferroelectric layer 22 may be annealed at a temperature in a range from about 200° C. to about 1000° C., such as from about 200° C. to about 500° C., and possibly from about 400° C. to about 700° C., or from about 600° C. to about 1000° C. The ferroelectric layer 22 may be annealed under an atmosphere containing at least one of Ar, $N_2$, $O_2$. During the annealing, a ferroelectric phase may be generated in the ferroelectric layer 22. Therefore, the ferroelectric layer 22 may exhibit ferroelectricity after the annealing. Alternatively, the ferroelectric layer 22 may exhibit stronger ferroelectricity than that before the annealing. The stabilization layer 23 may help the ferroelectric phase be formed in the ferroelectric layer 22 during the annealing. Also, the stabilization layer 23 may prevent the ferroelectric phase in the ferroelectric layer 22 from being vanished after the annealing. Therefore, according to the manufacturing method (1000) of the embodiment, the ferroelectric layer 22 having an improved ferroelectric property may be obtained.

Also, the oxygen diffusion barrier layer 24 and the silicon layer 50 may prevent oxygen from moving into the interfacial layer 21 and the thickness of the interfacial layer 21 from being increased during the annealing. For example, the increase in the thickness of the interfacial layer 21 during the annealing may be in a range from about 0 Å to about 3 Å. Therefore, according to the manufacturing method (1000) of the embodiment, the increase in the thickness of the interfacial layer 21 may be prevented during the annealing process.

In some embodiments, a process of removing the silicon layer 50 may be further provided after the annealing. In this case, the silicon layer 50 may be also referred to as a sacrificial layer. In some embodiments, the sacrificial layer may include a material that may function as an oxygen diffusion barrier, in addition to silicon. The silicon layer 50 may be removed by a wet-etching process or a dry-etching process. In some embodiments, a process of removing the oxygen diffusion barrier layer 24 after removing the silicon layer 50 may be further performed. In some embodiments, a process of removing the stabilization layer 23 after the removing of the oxygen diffusion barrier layer 24 may be further performed. In some embodiments, the process of forming the oxygen diffusion barrier layer 24 (S1400) may be omitted.

Figure 7A:
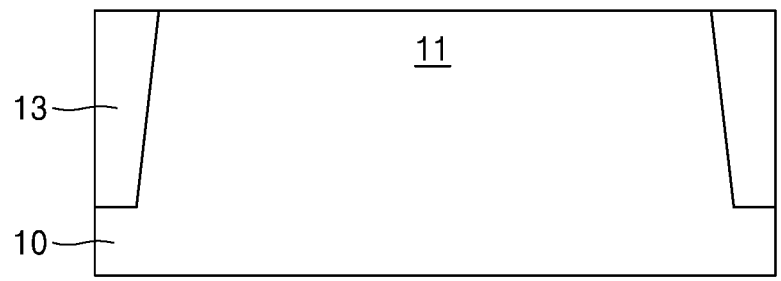
FIGS. 7A to 7H are diagrams illustrating a method of manufacturing a semiconductor device, according to an embodiment.
Figure 7B:
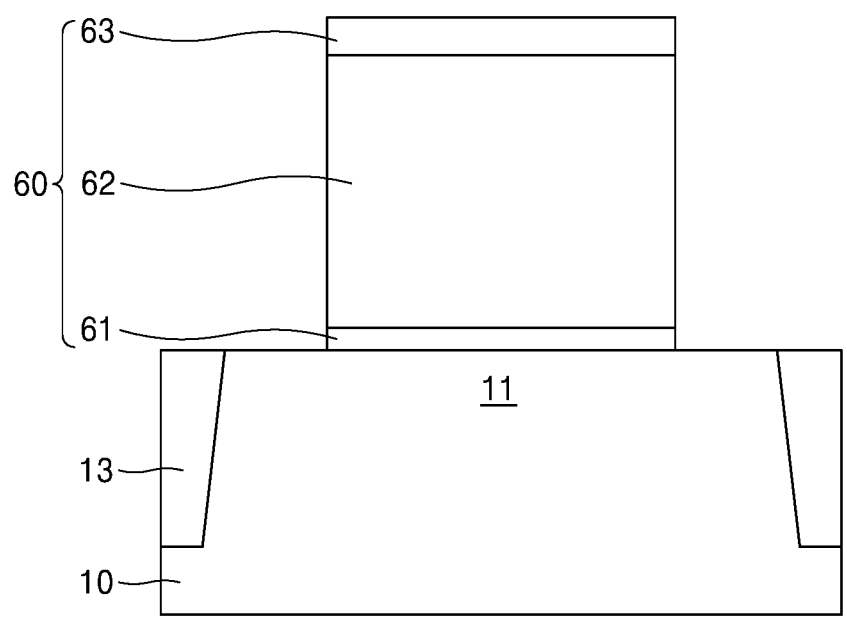

FIGS. 7A to 7H are diagrams illustrating a method of manufacturing a semiconductor device, according to an embodiment of the invention. Referring to FIG. 7A, the channel 11 and the device isolation layer 13 may be formed in or on the substrate 10. The channel 11 may be formed from the substrate 10 or from an epitaxial layer grown on the substrate 10, in some embodiments. Referring to FIG. 7B, a dummy gate structure 60 may be formed on the channel 11. In some embodiments of the invention, the dummy gate structure 60 may include a dummy gate insulating layer 61, a dummy gate electrode layer 62, and a dummy gate mask 63 that are stacked on the channel 11. The dummy gate insulating layer 61 may include, for example, silicon oxide, silicon nitride, or a combination thereof, but is not limited thereto. The dummy gate electrode layer 62 may include, for example, silicon, but is not limited thereto. The dummy gate mask 63 may include silicon oxide, silicon nitride, or a combination thereof, but is not limited thereto.

Figure 7C:
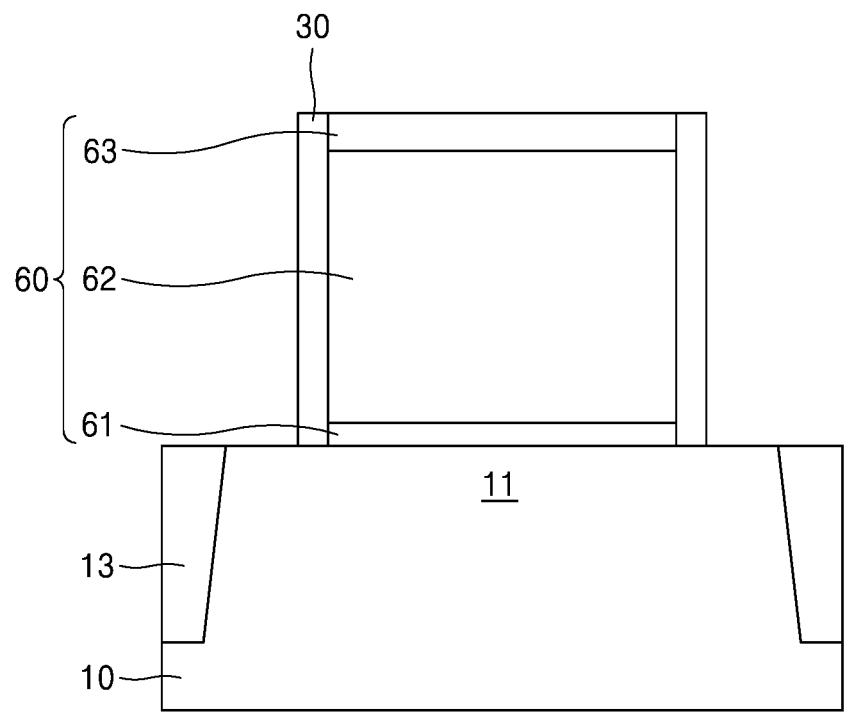
Figure 7D:
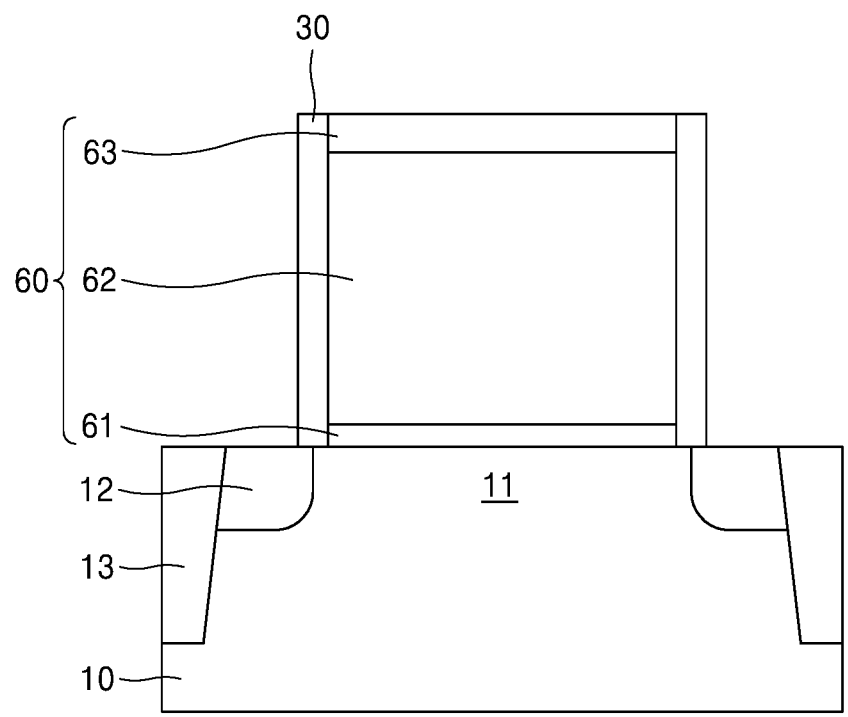

Referring to FIG. 7C, the gate spacers 30 may be formed on opposite side walls of the dummy gate structure 60. In detail, a gate spacer layer is formed on the dummy gate structure 60, and after that, the gate spacer layer is anisotropically etched to form the gate spacers 30. Referring to FIG. 7D, the source/drain 12 may be formed on opposite ends of the channel 11. The source/drain 12 may be formed from the substrate 10 by implanting impurities into the substrate 10. Alternatively, the source/drain 12 may be formed on the channel 11 through an epitaxial process.

Figure 7E:
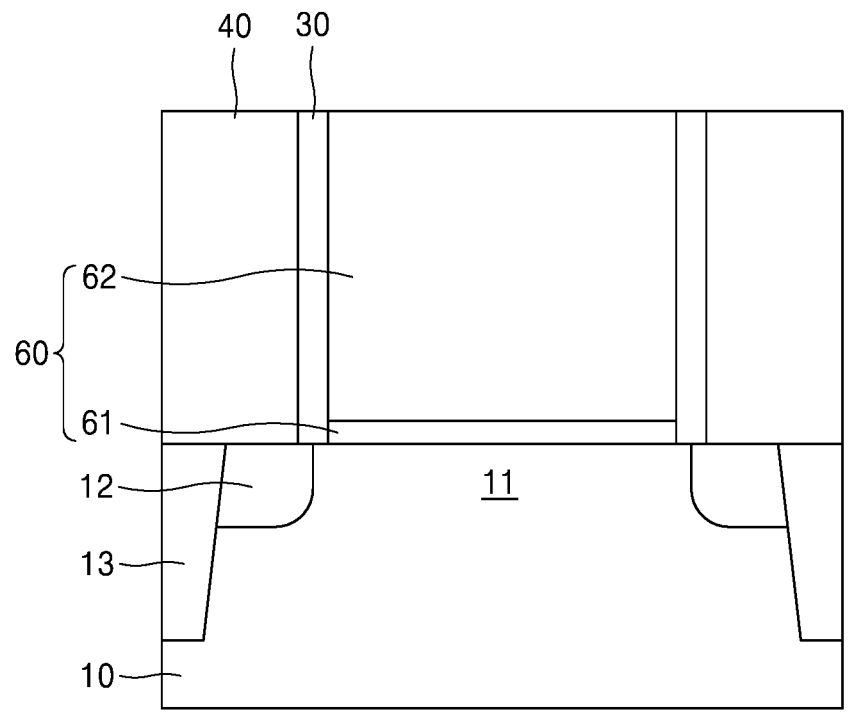

Referring to FIG. 7E, the interlayer insulating layer 40 filling a space from an upper surface of the substrate 10 to a height of an upper end of the dummy gate structure 60 may be formed. In detail, the interlayer insulating layer 40 is formed on the source/drain 12, the device isolation layer 13, and the dummy gate structure 60, and then the interlayer insulating layer 40 may be planarized so as to expose the dummy gate electrode layer 62 of the dummy gate structure 60. The planarization may be performed by, for example, chemical mechanical polishing (CMP).

Figure 7F:
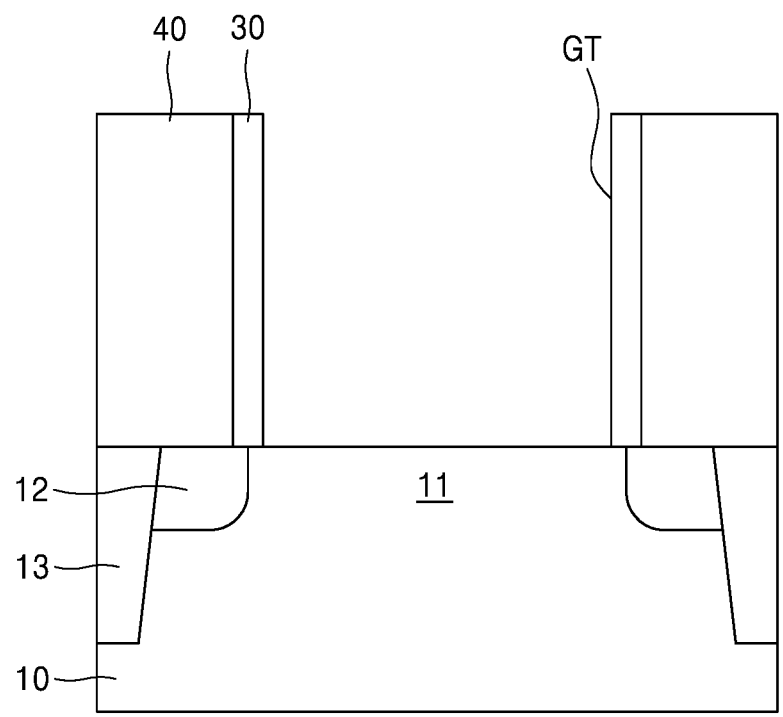
Figure 7G:
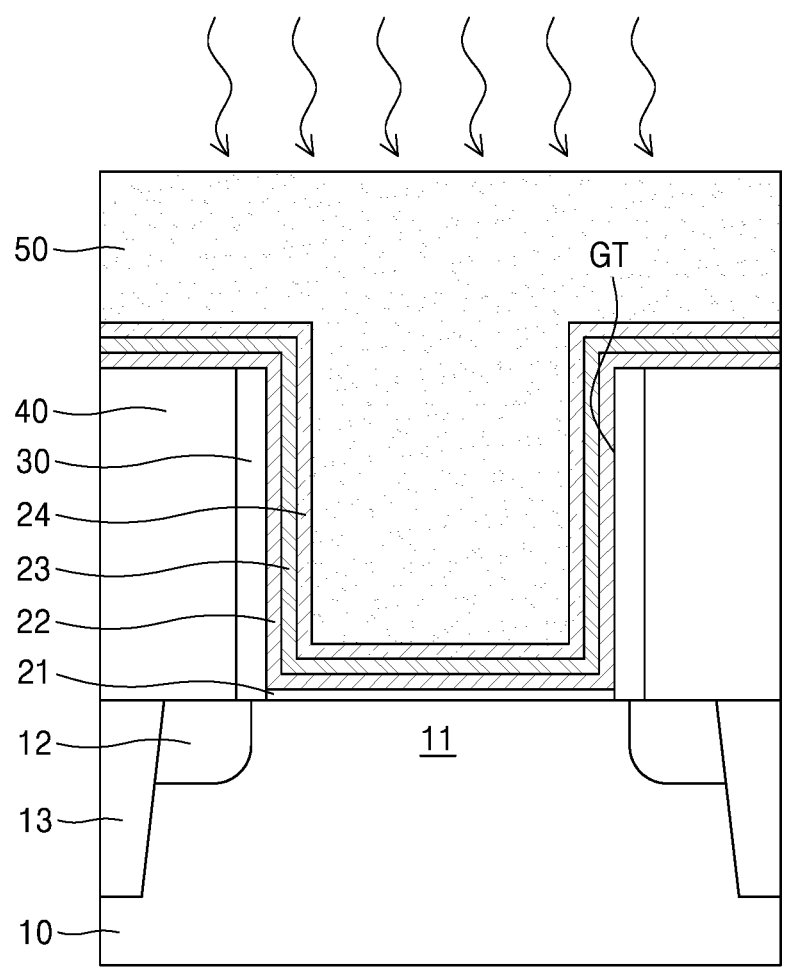

Referring to FIG. 7F, the dummy gate structure 60 is removed to form a gate trench GT that exposes internal walls of the gate spacers 30 and the channel 11. For example, the dummy gate structure 60 may be removed by, for example, a wet-etching process. Referring to FIG. 7G, processes of the method (1000) of manufacturing the semiconductor device described above with reference to FIGS. 5 and 6A to 6E may be performed. That is, the interfacial layer 21, the ferroelectric layer 22, the stabilization layer 23, the oxygen diffusion barrier layer 24, and the silicon layer 50 are sequentially formed on the channel 11 and the ferroelectric layer 22 may be annealed. Next, the silicon layer 50 may be removed.

Figure 7H:
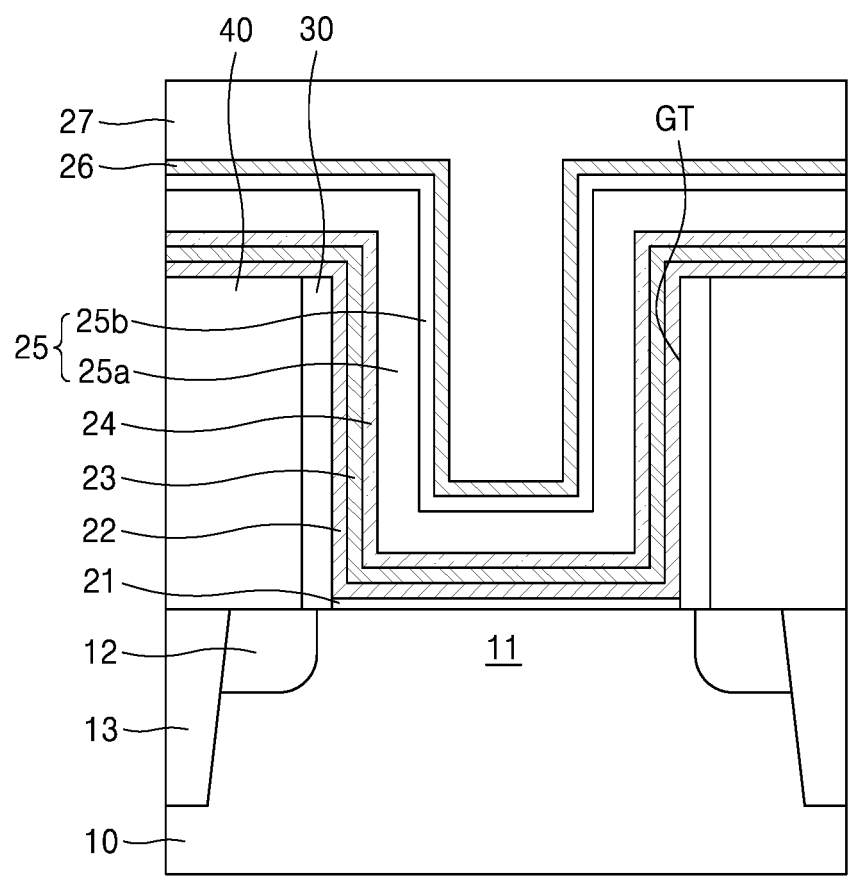

Referring to FIG. 7H, the threshold voltage control layer 25, the upper barrier layer 26, and the gate filling layer 27 may be formed sequentially on the oxygen diffusion barrier layer 24. In some embodiments of the invention, the forming of the threshold voltage control layer 25 may include a process of forming the lower threshold voltage control layer 25a on the oxygen diffusion barrier layer 24 and a process of forming the upper threshold voltage control layer 25b on the lower threshold voltage control layer 25a. The threshold voltage control layer 25, the upper barrier layer 26, and the gate filling layer 27 may be formed respectively by, for example, CVD, PVD, ALD, or a combination thereof.

Next, the ferroelectric layer 22, the stabilization layer 23, the oxygen diffusion barrier layer 24, the threshold voltage control layer 25, the upper barrier layer 26, and the gate filling layer 27 may be planarized so as to expose the interlayer insulating layer 40. As such, the semiconductor device 100 shown in FIG. 1 may be manufactured. In some embodiments, the channel 11 may be formed as a fin-type in the process shown in FIG. 7A. In this case, the semiconductor device 100b illustrated with reference to FIGS. 2A to 2C may be manufactured.

Figure 8A:
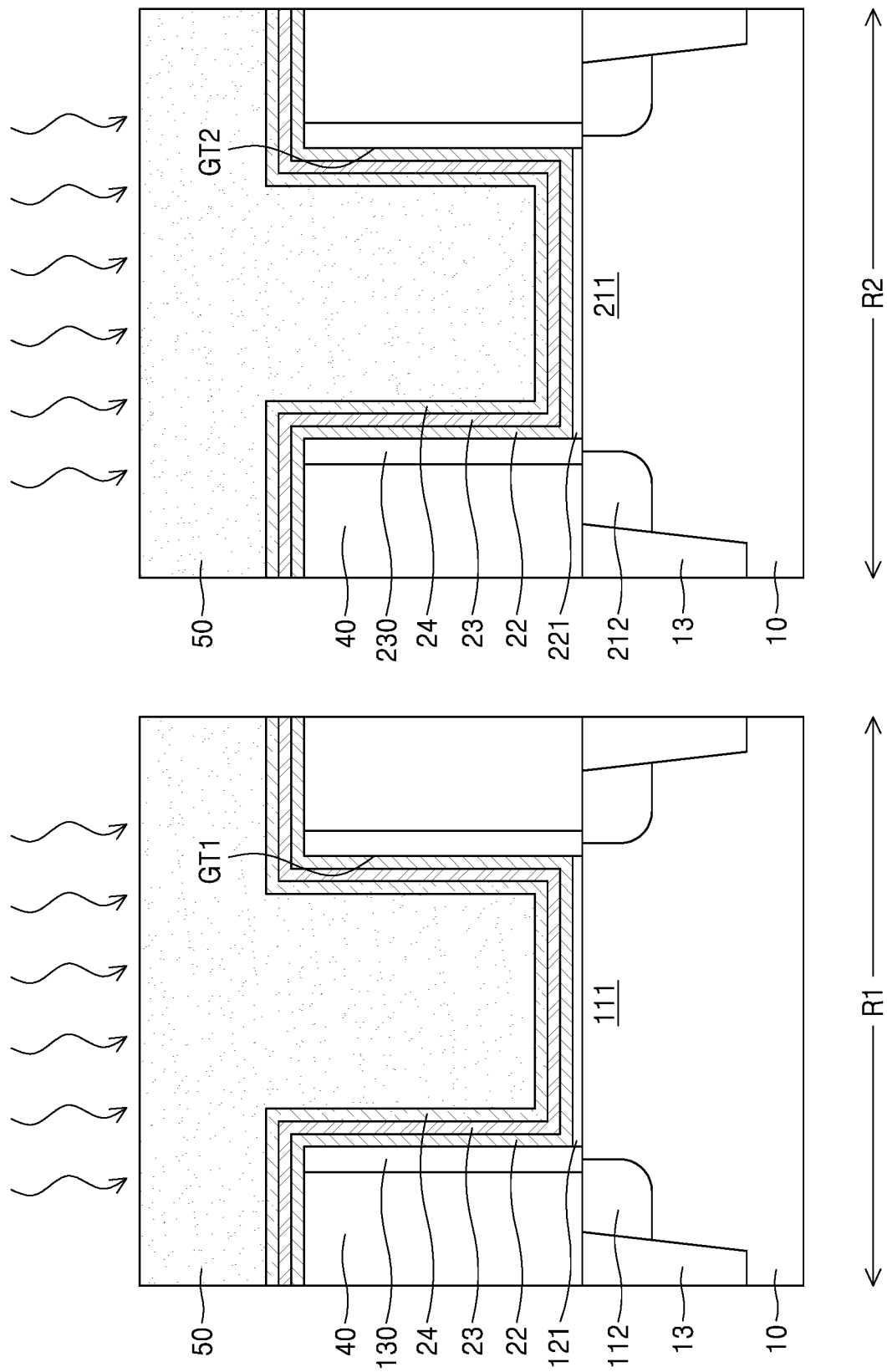
FIGS. 8A and 8B are diagrams illustrating a method of manufacturing a semiconductor device, according to an embodiment.
Figure 8B:
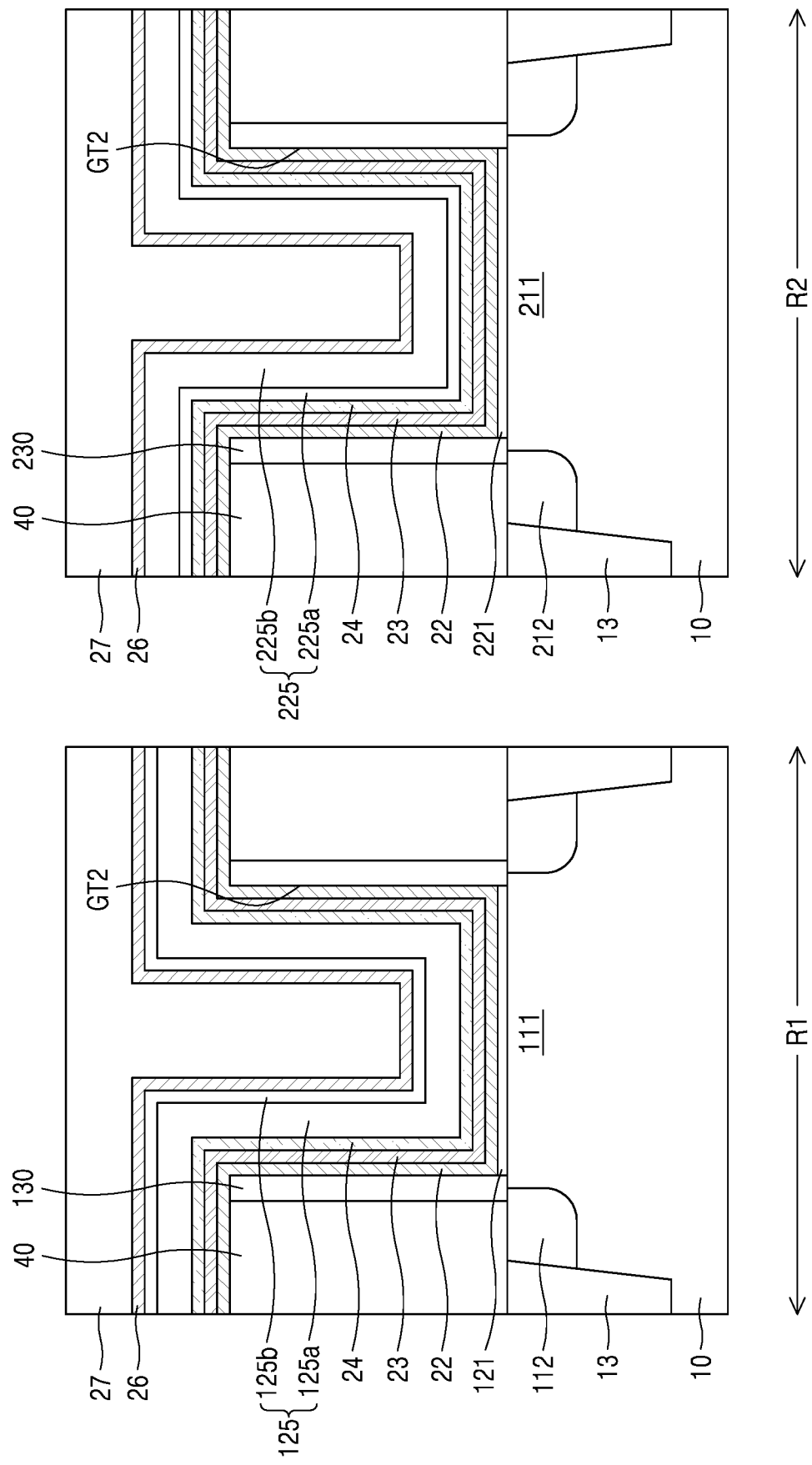

FIGS. 8A and 8B are diagrams illustrating a method of manufacturing a semiconductor device, according to an embodiment of the invention. Referring to FIG. 8A, according to the method illustrated with reference to FIGS. 7A to 7H, the first channel 111, one first source/drain pair 112, the first gate spacers 130, and a first gate trench GT1 are formed on the first region R1 of the substrate 10 and the second channel 211, one second source/drain pair 212, the second gate spacers 230, and a second gate trench GT2 are formed on the second region R2 of the substrate 10. In addition, the device isolation layer 13 and the interlayer insulating layer 40 may be formed on the first region R1 and the second region R2 in the substrate 10.

Next, the first interfacial layer 121 may be formed on the first region R1 of the substrate 10 and the second interfacial layer 221 may be formed on the second region R2 of the substrate 10. Then, the ferroelectric layer 22, the stabilization layer 23, the oxygen diffusion barrier layer 24, and the silicon layer 50 are sequentially formed on the first region R1 and the second region R2 of the substrate 10, and the ferroelectric layer 22 may be annealed. Next, the silicon layer 50 may be removed.

Referring to FIG. 8B, the first threshold voltage control layer 125 is formed on the first region R1 of the substrate 10 and the second threshold voltage control layer 225 is formed on the second region R2 of the substrate 10. Next, the upper barrier layer 26 is formed on the first region R1 and the second region R2 of the substrate 10 and the gate filling layer 27 may be formed on the first and second regions R1 and R2 of the substrate 10.

The ferroelectric layer 22, the stabilization layer 23, the oxygen diffusion barrier layer 24, the first threshold voltage control layer 125, the second threshold voltage control layer 225, the upper barrier layer 26, and the gate filling layer 27 may be planarized so as to expose the interlayer insulating layer 40. As such, the semiconductor device 200 shown in FIG. 4A may be manufactured.

Since both the first ferroelectric layer 122 and the second ferroelectric layer 222 shown in FIG. 4A may be formed from the ferroelectric layer 22, the first ferroelectric layer 122 and the second ferroelectric layer 222 may include the same material and may have the same thickness as each other. Since both the first stabilization layer 123 and the second stabilization layer 223 shown in FIG. 4A may be formed from the stabilization layer 23, the first stabilization layer 123 and the second stabilization layer 223 may include the same material and may have substantially the same thickness as each other. Since both the first oxygen diffusion barrier layer 124 and the second oxygen diffusion barrier layer 224 shown in FIG. 4B may be formed from the oxygen diffusion barrier layer 24, the first oxygen diffusion barrier layer 124 and the second oxygen diffusion barrier layer 224 may include the same material and may have substantially the same thickness as each other. Since both the first upper barrier layer 126 and the second upper barrier layer 226 shown in FIG. 4B may be formed from the upper barrier layer 26, the first upper barrier layer 126 and the second upper barrier layer 226 may include the same material and may have substantially the same thickness as each other. Since both the first gate filling layer 127 and the second gate filling layer 227 shown in FIG. 4B may be formed from the gate filling layer 27, the first and second gate filling layers 127 and 227 may include the same material.

In some embodiments, the method of manufacturing the semiconductor device may further include a process of removing a portion of the oxygen diffusion barrier layer 24 on the second region R2 of the substrate 10. In this case, the semiconductor device 200b shown in FIG. 4B may be manufactured. Since the portion of the oxygen diffusion barrier layer 24 on the second region R2 of the substrate 10 is removed while remaining the oxygen diffusion barrier layer 24 on the first region R1 of the substrate 10, the threshold voltages of the first transistor TR1 and the second transistor TR2 may be easily controlled.

In some embodiments of the invention, the method of manufacturing the semiconductor device may further include a process of removing a portion of the oxygen diffusion barrier layer 24 on the second region R2 of the substrate 10 and removing a portion of the stabilization layer 23 on the second region R2 of the substrate 10. In this case, the semiconductor device 200c shown in FIG. 4C may be manufactured. Since the portion of the stabilization layer 23 on the second region R2 of the substrate 10 is removed while remaining the portion of the stabilization layer 23 on the first region R1 of the substrate 10, the threshold voltages of the first transistor TR1 and the second transistor TR2 may be easily controlled.

In some embodiments, the process of forming the oxygen diffusion barrier layer 24 on the first region R1 and the second region R2 of the substrate 10 may be omitted. In this case, the semiconductor device 200d shown in FIG. 4D may be manufactured. In other embodiments, the process of forming the oxygen diffusion barrier layer 24 on the first region R1 and the second region R2 of the substrate 10 may be omitted, and the method of manufacturing the semiconductor device may further include a process of removing a portion of the stabilization layer 23 on the second region R2 of the substrate 10. In this case, the semiconductor device 200e shown in FIG. 4E may be manufactured.

Figure 9A:
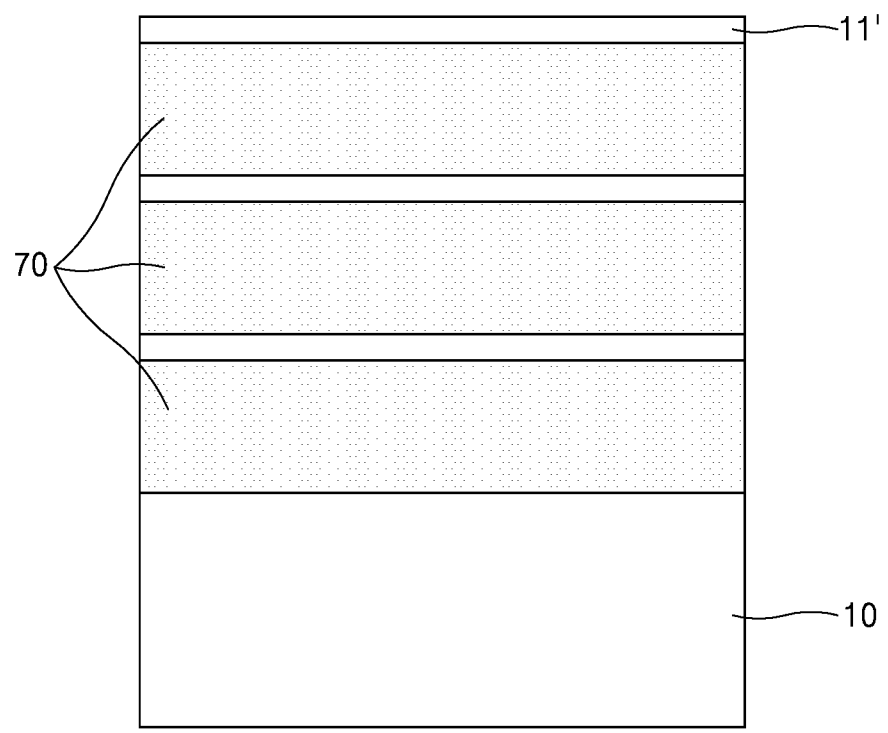
FIGS. 9A to 9G are diagrams illustrating a method of manufacturing a semiconductor device, according to an embodiment.

FIGS. 9A to 9G are diagrams illustrating a method of manufacturing a semiconductor device, according to an embodiment. Referring to FIG. 9A, a plurality of sacrificial layers 70 and a plurality of channel layers 11' may be alternately arranged on the substrate 10. In FIG. 9A, three sacrificial layers 70 and three channel layers 11' are formed, but the number of sacrificial layers 70 and the number of channel layers 11' are not limited to the above example. The sacrificial layer 70 and the channel layer 11' may be formed by epitaxial growth. The sacrificial layer 70 may include a material having an etch selectivity with respect to the channel layer 11'. For example, when the channel layer 11' includes Si, the sacrificial layer 70 may include Si—Ge. When the channel layer 11' include Ge or Si—Ge, the sacrificial layer 70 may include Si.

Figure 9B:
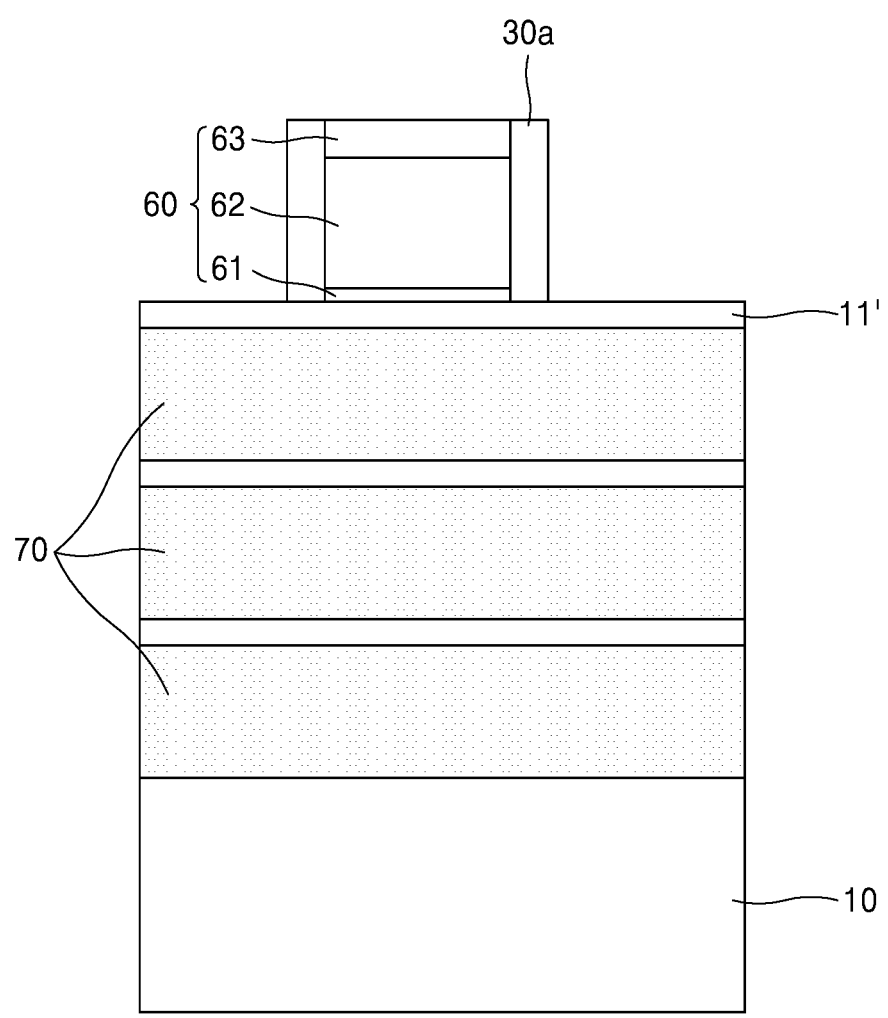

Referring to FIG. 9B, the dummy gate structure 60 may be formed on the uppermost channel layer 11'. The dummy gate structure 60 may include the dummy gate insulating layer 61, the dummy gate electrode layer 62, and the dummy gate mask 63 that are sequentially stacked on the channel layer 11'. The dummy gate structure 60 may be formed by etching the dummy gate insulating layer 61 and the dummy gate electrode layer 62 by using the dummy gate mask 63 as an etching mask. After that, a first gate spacer 30a may be formed on a side wall of the dummy gate structure 60. For example, a first gate spacer layer is formed on the dummy gate structure 60 and the uppermost channel layer 11', and after that, the first gate spacer layer is anisotropically etched to form the first gate spacer 30a.

Figure 9C:
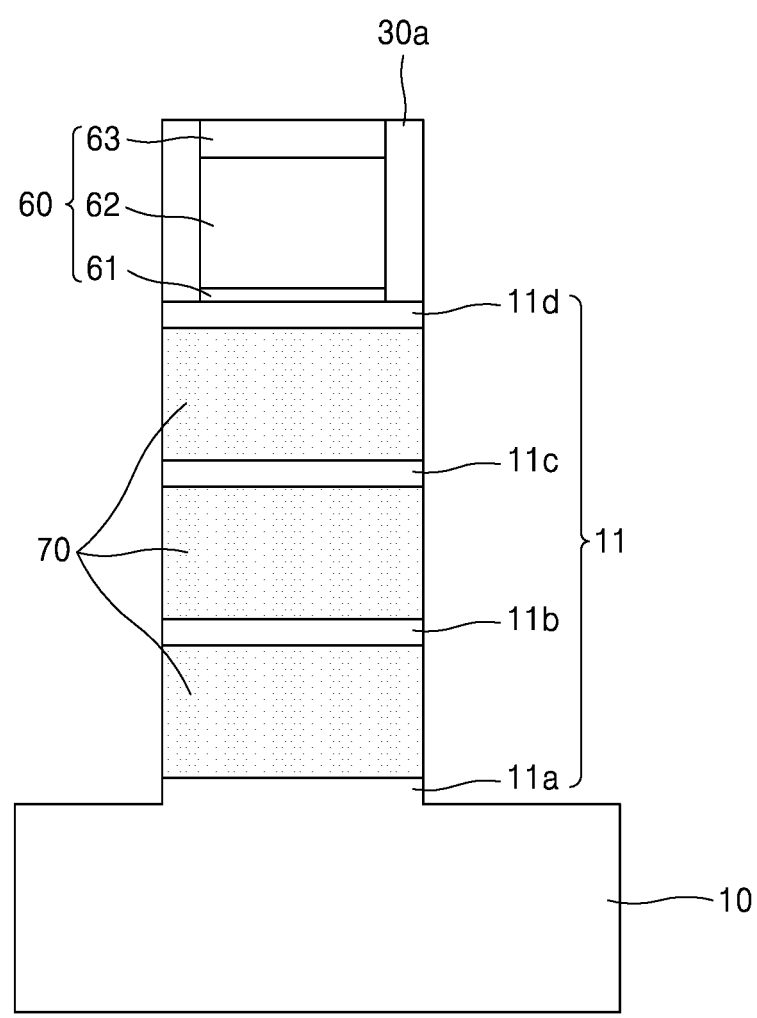

Referring to FIG. 9C, the plurality of sacrificial layers 70 and the plurality of channel layers 11' (see FIG. 9B) may be etched by using the dummy gate structure 60 and the first gate spacer 30a as an etching mask. As such, the channel 11 may be obtained. The channel 11 may include a plurality of portions 11b to 11d that are respectively formed from the plurality of channel layers 11' (see FIG. 9B). Also, the channel 11 may include the portion 11a at the lowermost part, wherein the portion 11a is formed from the substrate. The plurality of portions 11b to 11d of the channel 11 may be apart from one another due to the sacrificial layers 70 in the vertical direction.

Figure 9D:
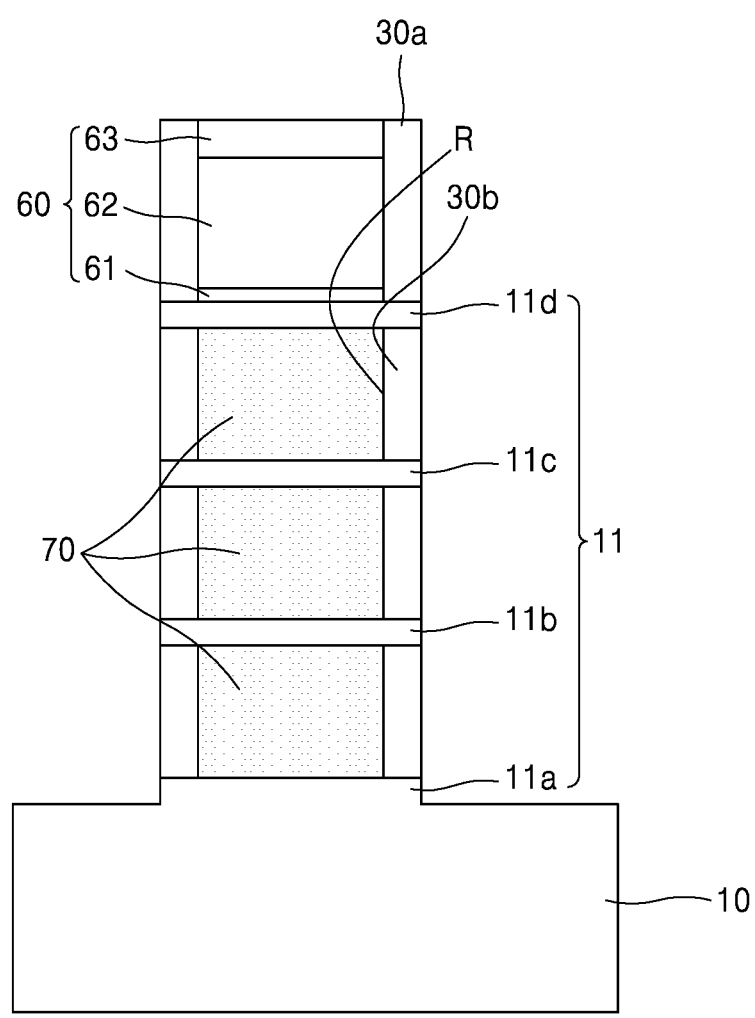

Referring to FIG. 9D, side wall portions of the sacrificial layers 70 are removed to form recesses R. For example, a wet-etching may be performed in order to form the recesses R. The recesses R may expose a lower surface of the portion 11d at the uppermost portion of the channel 11, upper and lower surfaces of the portions 11b and 11c at the intermediate portion of the channel 11, an upper surface of the portion 11a at the lowermost portion of the channel 11, and side walls of the sacrificial layers 70.

Next, a second gate spacer 30b filling the recesses R may be formed. For example, a second gate spacer layer is formed on the substrate 10, and after that, the second gate spacer layer is anisotropically etched to form the second gate spacer 30b.

Figure 9E:
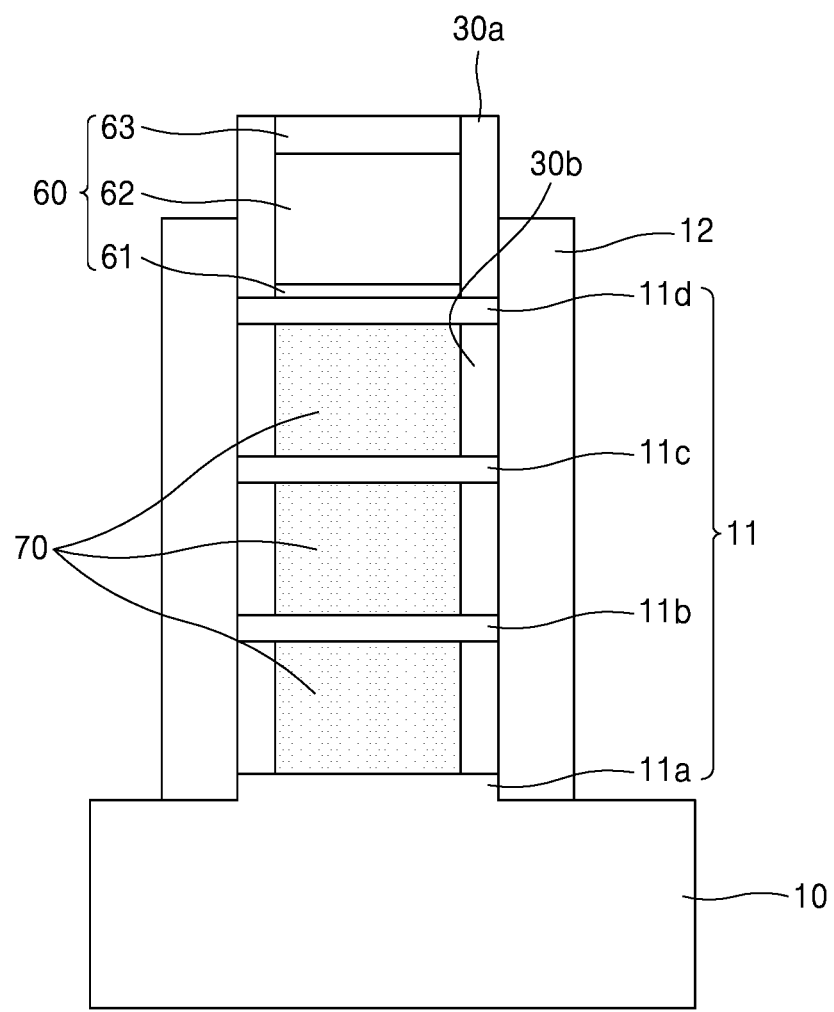

Referring to FIG. 9E, one source/drain pair 12 may be formed on the substrate 10. The source/drain 12 may be formed by an epitaxial growth. One of the source/drain 12 may be formed to be in contact with end portions of the plurality of portions 11a to 11d of the channel 11. The other of the source/drain 12 may be formed to be in contact with opposite end portions of the plurality of portions 11a to 11d of the channel 11.

Figure 9F:
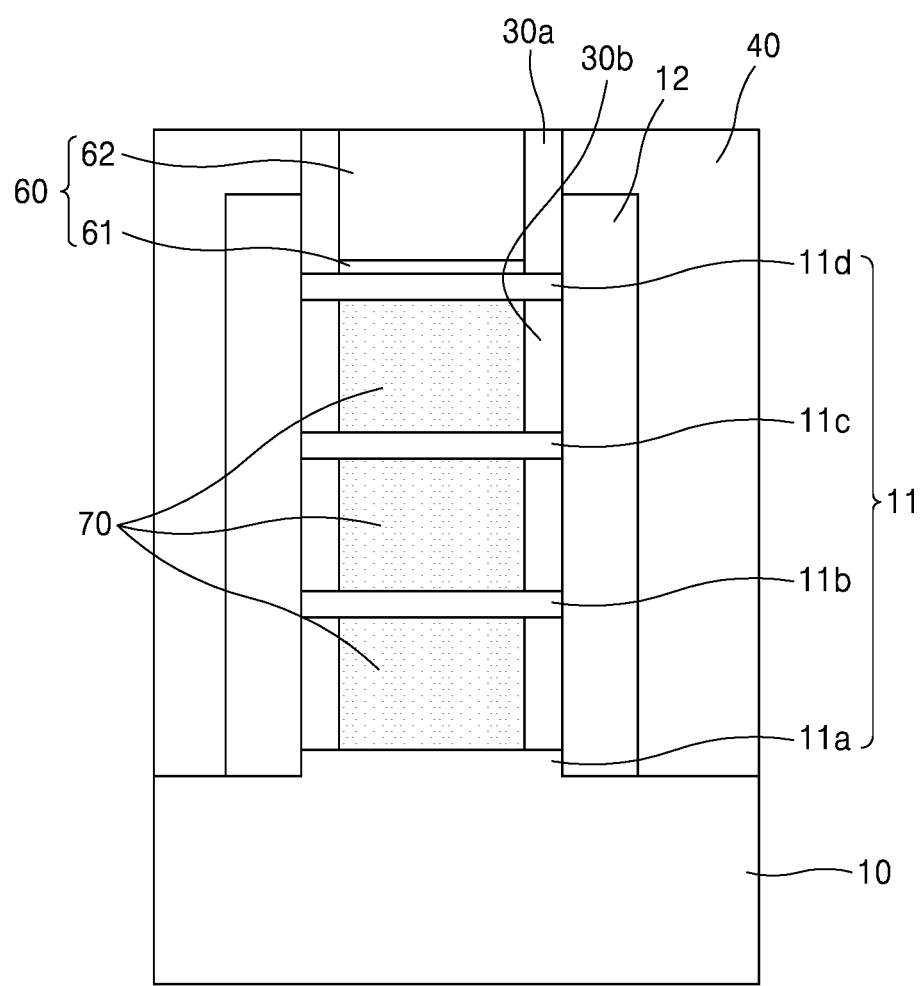

Referring to FIG. 9F, the interlayer insulating layer 40 may be formed on the substrate 10, one source/drain pair 12, and the dummy gate structure 60. After that, the interlayer insulating layer 40 may be planarized so as to expose the dummy gate electrode layer 62. The dummy gate mask 63 may be removed through the planarization. The planarization may include, for example, a CMP process.

Figure 9G:
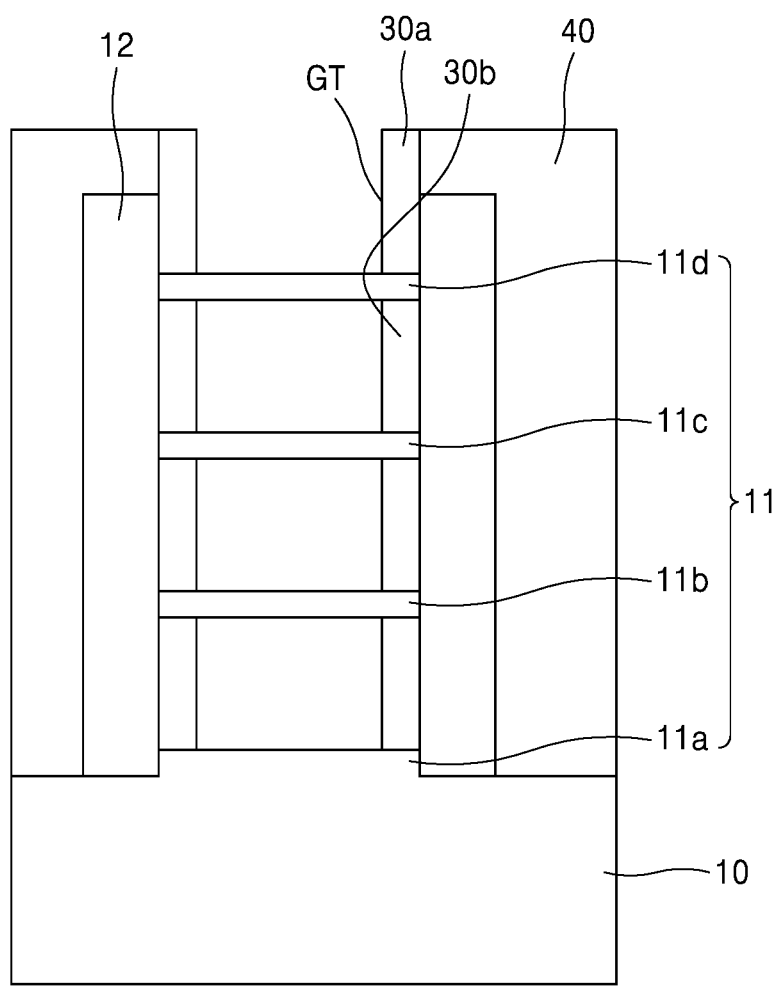

Referring to FIG. 9G, the dummy gate electrode layer 62 and the sacrificial layers 70 (see FIG. 9F) may be removed. Here, the wet-etching process, e.g., may be performed. As such, the gate trench GT may be formed and the gate trench GT exposes the internal wall of the first gate spacer 30a, the internal wall of the second gate spacer 30b, the upper surface of the lowermost portion 11a of the channel 11, and the upper and lower surfaces of the other portions 11b to 11d of the channel 11.

Referring again to FIG. 3, the gate structure 20 may be formed in the gate trench GT. First, according to the method (1000) of manufacturing the semiconductor device described above with reference to FIGS. 5 and 6A to 6E, the interfacial layer 21, the ferroelectric layer 22, the stabilization layer 23, the oxygen diffusion barrier layer 24, and the silicon layer 50 (see FIG. 6E) are formed on each of the portions 11a to 11d of the channel 11. Next, the ferroelectric layer 22 is annealed. After that, the silicon layer 50 (see FIG. 6E) is removed, and the threshold voltage control layer 25, the upper barrier layer 26, and the gate filling layer 27 may be sequentially formed on the oxygen diffusion barrier layer 24. As such, the semiconductor device 100c shown in FIG. 3 may be manufactured.

While the inventive concept has been particularly shown and described with reference to embodiments thereof, it will be understood that various changes in form and details may be made therein without departing from the spirit and scope of the following claims.

What is claimed is:

1. A semiconductor device, comprising:
a substrate comprising a first region and a second region;
a first gate structure on the first region of the substrate, said first gate structure comprising a first interfacial layer, a first ferroelectric layer, a first stabilization layer, a first oxygen diffusion barrier layer, and a first threshold voltage control layer that are sequentially stacked on the first region of the substrate; and
a second gate structure on the second region of the substrate, said second gate structure comprising a second interfacial layer, a second ferroelectric layer, a second stabilization layer, and a second threshold voltage control layer directly on the second stabilization layer, which are sequentially stacked on the second region of the substrate;
wherein the first stabilization layer is configured to stabilize a ferroelectric phase of the first ferroelectric layer to thereby preserve a ferroelectricity characteristic of the first ferroelectric layer; and
wherein the second stabilization layer is configured to stabilize a ferroelectric phase of the second ferroelectric layer to thereby preserve a ferroelectricity characteristic of the second ferroelectric layer.

2. The device of claim 1, wherein the first interfacial layer has a thickness in a range from 1 Å to 10 Å.

3. The device of claim 1, wherein the first stabilization layer and the first threshold voltage control layer comprise different materials.

4. The device of claim 3, wherein a material included in the first stabilization layer has a work function that is greater than a work function of a material included in the first threshold voltage control layer.

5. The device of claim 1, wherein the first stabilization layer comprises at least one material selected from a group consisting of TiN, MoN, Mo, $Al_2O_3$, AlN, W, WN, WCN, La, LaO, LaN, TiAlN, and TiON.

6. The device of claim 1, wherein the first oxygen diffusion barrier layer comprises at least one material selected from a group consisting of TiN, AlN, TaN, TiSiN, TiON, TiAlN, WCN, WN, and W.

7. The device of claim 1, wherein the first stabilization layer has a thickness that is equivalent to a thickness of the second stabilization layer.

8. The device of claim 1, wherein the first stabilization layer and the second stabilization layer comprise the same material.

9. The device of claim 1, wherein the first threshold voltage control layer comprises a first lower threshold voltage control layer on the first stabilization layer and a first upper threshold voltage control layer on the first lower threshold voltage control layer; and wherein the second threshold voltage control layer comprises a second lower threshold voltage control layer on the second ferroelectric layer and a second upper threshold voltage control layer on the second lower threshold voltage control layer.

10. The device of claim 9, wherein a material included in the first stabilization layer has a work function that is greater than a work function of a material included in the first upper threshold voltage control layer.

11. The device of claim 9, wherein a material included in the first stabilization layer has a work function that is greater than a work function of a material included in the first lower threshold voltage control layer.

* * * * *